(12) United States Patent
Yonemoto

(10) Patent No.: US 11,336,860 B2
(45) Date of Patent: May 17, 2022

(54) SOLID-STATE IMAGE CAPTURING DEVICE, METHOD OF DRIVING SOLID-STATE IMAGE CAPTURING DEVICE, AND ELECTRONIC APPARATUS

(71) Applicant: Sony Semiconductor Solutions Corporation, Kanagawa (JP)

(72) Inventor: Kazuya Yonemoto, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 17/270,200

(22) PCT Filed: Aug. 16, 2019

(86) PCT No.: PCT/JP2019/032122
§ 371 (c)(1),
(2) Date: Feb. 22, 2021

(87) PCT Pub. No.: WO2020/045122
PCT Pub. Date: Mar. 5, 2020

(65) Prior Publication Data
US 2021/0314516 A1    Oct. 7, 2021

(30) Foreign Application Priority Data

Aug. 31, 2018  (JP) .............................. JP2018-163988

(51) Int. Cl.
*H04N 5/374*     (2011.01)
*H04N 5/376*     (2011.01)
(Continued)

(52) U.S. Cl.
CPC ........... *H04N 5/379* (2018.08); *H04N 5/3765* (2013.01); *H04N 5/37457* (2013.01); *H04N 5/37455* (2013.01)

(58) Field of Classification Search
CPC .............. H04N 5/374; H04N 5/37455; H04N 5/37465; H04N 5/369; H04N 5/378;
(Continued)

(56) References Cited

U.S. PATENT DOCUMENTS

| 2014/0036123 A1* | 2/2014 | Sakakibara | ............ H04N 5/335 348/302 |
| 2014/0042298 A1* | 2/2014 | Wan | ...................... H01L 27/146 205/208.1 |

(Continued)

FOREIGN PATENT DOCUMENTS

| JP | 2013-90304 A | 5/2013 |
| WO | 2017/169480 A1 | 10/2017 |
| WO | 2018/037901 A1 | 3/2018 |

OTHER PUBLICATIONS

International Search Report (PCT/ISA/210), International Application No. PCT/JP2019/032122, dated Oct. 8, 2019.

(Continued)

Primary Examiner — Marly S Camargo
(74) Attorney, Agent, or Firm — Michael Best & Friedrich LLP

(57) ABSTRACT

An AD conversion circuit with reduced comparator noise is disclosed. In one example, a solid-state image capturing device includes at least three stacked substrates, in which for each pixel block, a first substrate includes a photoelectric conversion unit that generates electric charges according to incident light, a transfer transistor, and a floating diffusion, a second substrate includes one comparator that compares a signal according to a voltage of the floating diffusion with a reference signal, a third substrate includes a code generation circuit that generates a code of a counter, a storage unit that stores the code, and a timing control circuit that controls a timing of storing the code in the storage unit, and the (Continued)

solid-state image capturing device further includes a pixel array in which a plurality of the pixel blocks is arranged.

20 Claims, 25 Drawing Sheets

(51) Int. Cl.
*H01L 27/146* (2006.01)
*H04N 5/369* (2011.01)
*H04N 5/3745* (2011.01)

(58) Field of Classification Search
CPC ........... H04N 5/379; H03M 1/64; H03K 5/24; H03K 5/2427; H01L 25/0657; H01L 27/146
USPC .......... 348/207.99, 308, 301, 302, 294, 297; 257/291, 292, 293, 443, 226, 299, 304, 257/315; 250/208.1; 341/155–158; 438/67, 107

See application file for complete search history.

(56) References Cited

U.S. PATENT DOCUMENTS

| | | | |
|---|---|---|---|
| 2017/0229509 A1* | 7/2017 | Lee | ................... H01L 27/14643 |
| 2019/0008110 A1 | 1/2019 | Mozzoni | |
| 2019/0207596 A1 | 4/2019 | Sakakibara | |
| 2019/0296075 A1* | 9/2019 | Oh | .................... H01L 27/14643 |

OTHER PUBLICATIONS

Notification of Transmittal of the International Search Report and the Written Opinion of the International Searching Authority, or the Declaration (PCT/ISA/220), International Application No. PCT/JP2019/032122, dated Oct. 21, 2019.

* cited by examiner

SOLID-STATE IMAGE CAPTURING DEVICE, METHOD OF DRIVING SOLID-STATE IMAGE CAPTURING DEVICE, AND ELECTRONIC APPARATUS

TECHNICAL FIELD

The present technology relates to a solid-state image capturing device, a method of driving the solid-state image capturing device, and an electronic apparatus. In particular, the present technology relates to a solid-state image capturing device that includes an AD conversion circuit for a plurality of pixels and can reduce comparator noise, a method of driving the solid-state image capturing device, and an electronic apparatus.

BACKGROUND ART

There has been known a technique of achieving a solid-state image capturing device with a stacked structure of a plurality of semiconductor substrates. For example, there has been provided a solid-state image capturing device with a stacked structure in which a pixel circuit including a photoelectric conversion unit, a transfer transistor, and the like is provided on a first semiconductor substrate, and an AD conversion circuit that performs AD conversion on pixel signals output from the pixel circuit is provided on a second semiconductor substrate (see, for example, Patent Document 1).

CITATION LIST

Patent Document

Patent Document 1: Japanese Patent Application Laid-Open No. 2017-103771

SUMMARY OF THE INVENTION

Problems to be Solved By the Invention

However, if it is attempted to achieve a solid-state image capturing device that includes an AD conversion circuit for a plurality of pixels with a two-layer stacked structure, the comparator becomes small in size and the noise performance is degraded.

The present technology has been made in view of such a circumstance, and makes it possible to reduce comparator noise in a solid-state image capturing device including an AD conversion circuit for a plurality of pixels.

Solutions to Problems

A solid-state image capturing device according to a first aspect of the present technology includes at least three substrates that are stacked, in which for each pixel block including a plurality of pixels, a first substrate includes, for each of the pixels, a photoelectric conversion unit that generates electric charges according to incident light, a transfer transistor, and a floating diffusion, a second substrate includes one comparator that compares a signal according to a voltage of the floating diffusion with a reference signal, the plurality of pixels shares the comparator, a third substrate includes a code generation circuit that generates a code of a counter, a storage unit that stores the code, and a timing control circuit that controls a timing of storing the code in the storage unit, and the solid-state image capturing device further includes a pixel array in which a plurality of the pixel blocks is arranged.

A method of driving a solid-state image capturing device according to a second aspect of the present technology, in which the solid-state image capturing device includes at least three substrates that are stacked, for each pixel block including a plurality of pixels, a first substrate includes, for each of the pixels, a photoelectric conversion unit that generates electric charges according to incident light, a transfer transistor, and a floating diffusion, a second substrate includes one comparator that compares a signal according to a voltage of the floating diffusion with a reference signal, the plurality of pixels shares the comparator, a third substrate includes a code generation circuit that generates a code of a counter, a storage unit that stores the code, and a timing control circuit that control a timing of storing the code in the storage unit, and the solid-state image capturing device further includes a pixel array in which a plurality of the pixel blocks is arranged, the method includes: by each pixel of the first substrate of the solid-state image capturing device, outputting a signal according to a voltage of the floating diffusion to the comparator; by the comparator of the second substrate of the solid-state image capturing device, comparing the signal with the reference signal; and by the storage unit of the third substrate of the solid-state image capturing device, storing the code supplied from the code generation circuit according to the timing based on a comparison result of the comparator.

An electronic apparatus according to a third aspect of the present technology includes a solid-state image capturing device, in which the solid-state image capturing device includes at least three substrates that are stacked, for each pixel block including a plurality of pixels, a first substrate includes, for each of the pixels, a photoelectric conversion unit that generates electric charges according to incident light, a transfer transistor, and a floating diffusion, a second substrate includes one comparator that compares a signal according to a voltage of the floating diffusion with a reference signal, the plurality of pixels shares the comparator, a third substrate includes a code generation circuit that generates a code of a counter, a storage unit that stores the code, and a timing control circuit that controls a timing of storing the code in the storage unit, and the solid-state image capturing device further includes a pixel array in which a plurality of the pixel blocks is arranged.

According to the first to third aspects of the present technology, at least three substrates are stacked, for each pixel block including a plurality of pixels, a first substrate is provided with, for each of the pixels, a photoelectric conversion unit that generates electric charges according to incident light, a transfer transistor, and a floating diffusion, a second substrate is provided with one comparator that compares a signal according to a voltage of the floating diffusion with a reference signal, the plurality of pixels shares the comparator, a third substrate is provided with a code generation circuit that generates a code of a counter, a storage unit that stores the code, and a timing control circuit that controls a timing of storing the code in the storage unit, and a pixel array in which a plurality of the pixel blocks is arranged is further provided.

The solid-state image capturing device and the electronic apparatus may be independent devices or may be modules incorporated in other devices.

Effects of the Invention

According to the first to third aspects of the present technology, the noise of the comparator can be reduced.

It should be noted that the effects described here are not necessarily limited, and may be any of the effects described in the present disclosure.

MODE FOR CARRYING OUT THE INVENTION

Hereinafter, modes for carrying out the present technology (hereinafter, referred to as "embodiments") will be described. It should be noted that the description is given in the following order.

1. Overall Configuration Example of Solid-State Image Capturing Device
2. Circuit Configuration of First Embodiment
3. Circuit Configuration of Second Embodiment
4. Circuit Configuration of Third Embodiment
5. Circuit. Configuration of Fourth Embodiment
6. Circuit Configuration of. Fifth Embodiment
7. First Configuration Example of Third Substrate
8. Second Configuration Example of Third Substrate
9. Third Configuration Example of Third Substrate
10. Example of Cross-Sectional Structure of Pixel Array
11. Example of Planar Structure of Pixel Array
12. Relationship of Outer Shapes of Respective Blocks of Three Layers
13. Positional Relationship of Respective Blocks of Three Layers
14. Example of Arrangement of Gray Code Generation Circuit
15. Example of Application to Electronic Apparatus
16. Example of Application to Moving Body <1. Overall Configuration Example of Solid-State Image Capturing Device>

Figure 1:
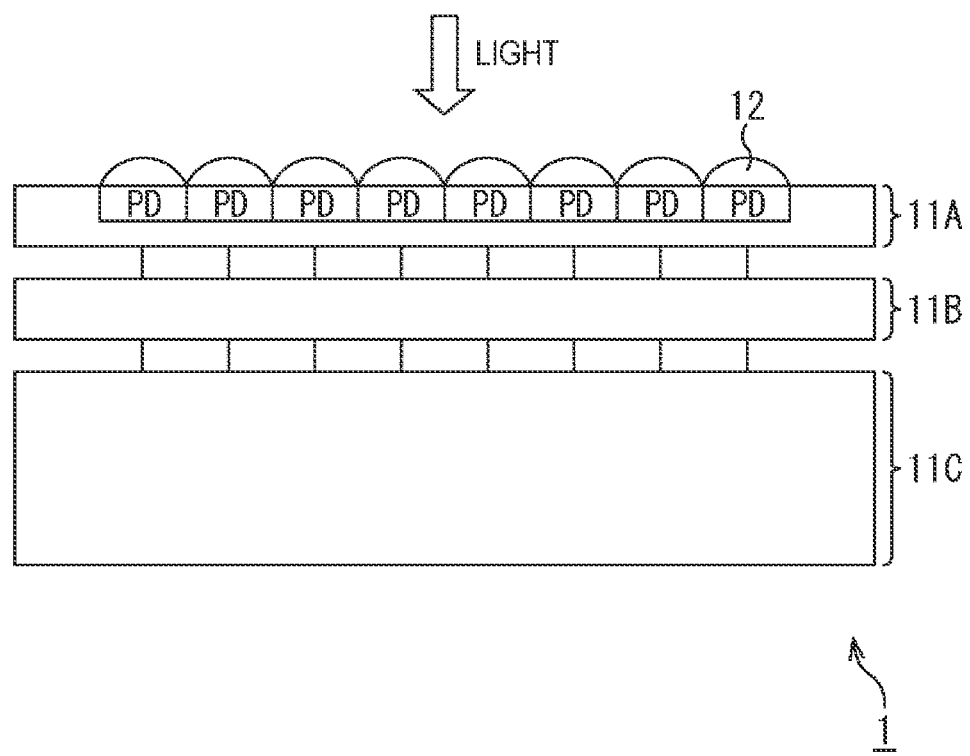
FIG. 1 is a cross-sectional view illustrating a schematic configuration of a solid-state image capturing device to which the present technology is applied.

FIG. 1 is a cross-sectional view illustrating a schematic configuration of a solid-state image capturing device to which the present technology is applied.

A solid-state image capturing device 1 illustrated in FIG. 1 converts light or electromagnetic waves entering the device in a direction of an arrow of FIG. 1 into an electric signal. Hereinafter, a description will be given by using a device that converts light into an electric signal as an example of an object to be converted into an electric signal, for convenience.

The solid-state image capturing device 1 includes a pixel array in which pixels are two-dimensionally arranged in a matrix, and outputs a pixel signal obtained by photoelectrically converting incident light with a photodiode PD of each pixel.

The solid-state image capturing device 1 has a stacked structure in which three layers of a first substrate 11A a second substrate 11B, and a third substrate 11C are stacked. Wires of two substrates connected vertically, that is, each of wires of the first substrate 11A and the second substrate 11B and wires of the second substrate 11B and the third substrate 11C are electrically connected to each other by metal bonding such as Cu—Cu bonding. Hereinafter, in a case where it is not necessary to distinguish the first substrate 11A, the second substrate 11B, and the third substrate 11C, it is simply referred to as "substrate 11".

On the first substrate 11A, pixels that convert incident light into an electric signal are two-dimensionally arranged in a matrix in a row direction and a column direction. Each pixel of the first substrate 11A includes, for example, the photodiode PD for photoelectric conversion, a microlens 12 that collects incident light on the photodiode PD, and the like.

The second substrate 11B and the third substrate 11C include a signal processing circuit that processes a pixel signal Vsig output from each pixel of the first substrate 11A.

<2. Circuit Configuration of First Embodiment>

Figure 2:
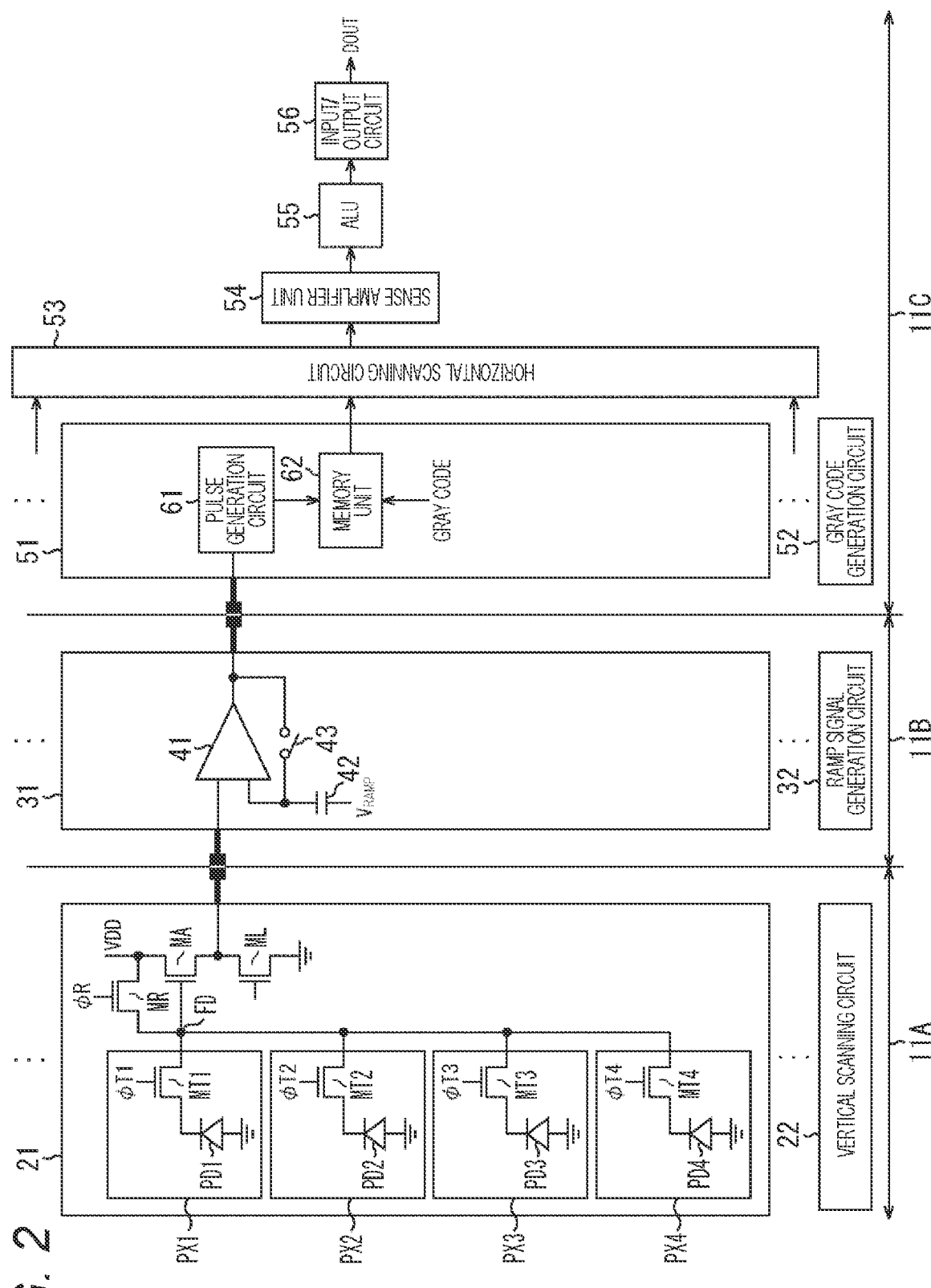
FIG. 2 is a diagram illustrating a circuit configuration of the solid-state image capturing device illustrated in FIG. 1, according to a first embodiment.

FIG. 2 illustrates a circuit configuration of the solid-state image capturing device 1 including the three-layer substrate 11, according to a first embodiment.

The first substrate 11A includes a plurality of pixel blocks 21 each of which includes a plurality of pixels PX and a vertical scanning circuit 22. A plurality of the pixel blocks 21 is arranged in a matrix to form a pixel array, but only one pixel block 21 is illustrated in FIG. 2. The present embodiment describes an example in which the pixel block 21 includes four pixels PX, but the number of pixels constituting the pixel block 21 is not limited to four.

In each of the pixel blocks 21 of the first substrate 11A, the photodiode PD and a transfer transistor MT are provided for each pixel PX, whereas a floating diffusion FD, a reset transistor MR, an amplification transistor MA, and a load transistor ML are provided for each pixel block 21.

That is, one pixel block 21 including four pixels has four photodiodes PD and four transfer transistors MT, one floating diffusion FD, one reset transistor MR, one amplification transistor MA, and one load transistor ML. The floating diffusion FD, the reset transistor MR, the amplification transistor MA, and the load transistor Ml are shared by these four pixels.

In a case where the four pixels PX constituting one pixel block 21 are distinguished as pixels PX1 to PX4, the pixel PX1 includes a photodiode PD1 and a transfer transistor MT1, the pixel PX2 includes a photodiode PD2 and a transfer transistor MT2, the pixel PX3 includes a photodiode PD3 and a transfer transistor MT3, and the pixel PX4 includes a photodiode PD4 and a transfer transistor MT4.

The photodiode PD generates electric charges (electrons) according to the incident light, and accumulates the electric charges. When the transfer transistor MT is brought into a conductive state by a transfer signal φT, the transfer transistor MT reads out the electric charges (electrons) generated by the photodiode PD and transfers the electric charges to the floating diffusion FD. The floating diffusion FD is an electric charge holding unit that temporarily holds the electric charges until the electric charges transferred from the photodiode PD are read out.

When the reset transistor MR is brought into a conductive state by a reset control signal φR, the reset transistor MR resets the potential of the floating diffusion FD by the electric charges held in the floating diffusion FD being discharged to a power supply voltage VDD.

The amplification transistor MA outputs the pixel signal Vsig according to the potential of the floating diffusion FD. That is, the amplification transistor MA configures a source follower circuit with the load transistor ML functioning as a constant current source, and outputs the pixel signal Vsig indicating a level corresponding to the electric charges held in the floating diffusion FD from the amplification transistor MA.

The vertical scanning circuit 22 is a drive control unit that controls the photoelectric conversion operation of each pixel PX and an operation of reading a photoelectrically converted electric signal, and supplies the transfer signal φT and the reset control signal φR to each pixel block 21.

The second substrate 11B includes a plurality of ADC analog blocks 31 and a ramp signal generation circuit 32. One ADC analog block 31 and the ramp signal generation circuit 32 are illustrated in FIG. 2.

The ADC analog block 31 is provided in a one-to-one correspondence with the pixel block 21 formed on the first substrate 11A. In other words, the second substrate 11B includes the ADC analog blocks 31 as many as the pixel blocks 21 formed on the first substrate 11A.

The ADC analog block 31 includes a comparator (comparator) 41, a capacitor (capacitive element) 42, and a switch 43.

The comparator 41 compares a ramp signal $V_{RAMP}$ supplied as a reference signal from the ramp signal generation circuit 32 with the pixel signal Vsig supplied from the pixel block 21, and outputs a comparison result signal indicating the comparison result to the third substrate 11C. In the comparator 41, the pixel signal Vsig whose magnitude is compared with the ramp signal $V_{RAMP}$, which is a reference signal, includes two signals, that is, a reset level signal and an optical signal (signal due to electric charges generated as result of photoelectric conversion in photodiode PD). The reset level signal is the pixel signal Vsig immediately after resetting the floating diffusion FD, whereas the optical signal is the pixel signal Vsig after the signal charges accumulated in the photodiode PD are transferred to the floating diffusion FD. For example, in a case where the ramp signal $V_{RAMP}$ is larger than the pixel signal Vsig, the comparison result signal is a Hi (High) signal, and in a case where the ramp signal $V_{RAMP}$ is smaller than the pixel signal Vsig, the comparison result signal is a Lo (Low) signal.

The capacitor 42 and the switch 43 perform an auto-zero operation in which an input terminal and an output terminal of the comparator 41 are short-circuited to reset the reference level of the comparator 41.

The ramp signal generation circuit 32 generates the ramp signal $V_{RAMP}$ whose level (voltage) changes stepwise with the time passes, and supplies the ramp signal to the comparator 41 of each ADC analog block 31.

The third substrate 11C includes a plurality of ADC digital memory blocks 51, a Gray code generation circuit 52, a horizontal scanning circuit 53, a sense amplifier unit 54, an arithmetic logical unit (ALU) 55, and an input/output circuit 56.

The ADC digital memory block 51 is provided in a one-to-one correspondence with the ADC analog block 31 formed on the second substrate 11B. In other words, the third substrate 11C includes the ADC digital memory blocks 51 as many as the pixel blocks 21 of the first substrate 11A and the ADC analog blocks 31 of the second substrate 11B. One ADC digital memory block 51 is illustrated in FIG. 2.

The ADC digital memory block 51 includes a pulse generation circuit 61 and a memory unit 62 (latch storage unit).

In the comparator 41, two types of pixel signals Vsig (reset level signal and optical signal) are compared in magnitude with the ramp signal $V_{RAMP}$, which is a reference signal, and at each timing when the magnitude relationship between the pixel signal Vsig and the reference signal is inverted, the comparison result signal is input from the comparator 41 to the pulse generation circuit 61. The pulse generation circuit 61 (timing control circuit) generates a pulse according to the inversion timing of the comparison result signal that is the output of the comparator 41, and supplies the pulse to the memory unit 62. The memory unit 62 stores the Gray code supplied from the Gray code generation circuit 52 at the timing of the pulse supplied from the pulse generation circuit 61. Two signals, that is, a reset level signal and an optical signal are stored as Gray codes in the memory unit 62. These two Gray codes stored in the memory unit 62 are subjected to a subtraction process in the ALU 55 to be described later, in order to perform correlated double sampling (CDS).

In order to count the time from when the comparator 41 starts comparing the magnitude of the lamp signal $V_{RAMP}$ with the magnitude of the pixel signal Vsig to when the magnitude relationship is reversed, the Gray code generation circuit 52 generates a Gray code (code of a counter), which is a counter signal, and supplies the Gray code to the memory unit 62. Note that while the Gray code generation circuit 52 is provided outside the ADC digital memory block 51 in FIG. 2, as will be described later, the Gray code generation circuit 52 is provided inside the ADC digital memory block 51 in some cases.

The ADC analog block 31 of the second substrate 11B and the corresponding ADC digital memory block 51 of the third substrate 11C configure an analog to digital converter (ADC).

The horizontal scanning circuit 53 sequentially selects a plurality of the ADC digital memory blocks 51 arranged in a horizontal direction, and outputs the Gray code stored in the memory unit 62 of the ADC digital memory block 51 to the sense amplifier unit 54.

The sense amplifier unit 54 amplifies the Gray code (Gray code signal) supplied from the horizontal scanning circuit 53 and outputs the resultant Gray code to the ALU 55.

The ALU 55 converts two Gray codes corresponding to a reset level signal and an optical signal into binary codes, and performs a CDS calculation of subtracting the reset level signal from the optical signal. Furthermore, the ALU 55 may also perform a frame addition process of adding pixel signals of a plurality of frames, a same-color pixel addition process of adding pixel signals of a plurality of adjacent pixels of the same color in one frame or a plurality of frames, and the like.

The input/output circuit 56 outputs a pixel signal of each pixel PX subjected to the CDS calculation to the outside of the device, and receives an input of a command for controlling the solid-state image capturing device 1.

According to the circuit configuration of the first embodiment configured as described above, one pixel block 21 including a plurality of pixels PX is provided on the first substrate 11A, the ADC analog block 31 corresponding to the pixel block 21 is provided on the second substrate 11B, and the ADC digital memory block 51 corresponding to the pixel block 21 is provided on the third substrate 11C. As these blocks are arranged separately on three substrates 11, one ADC analog block 31 and one ADC digital memory block 51 can be provided for each pixel block 21. Since one comparator 41 is provided for four pixels, a large area for forming the comparator 41 can be secured, and the noise of the comparator 41 can be reduced.

<3. Circuit Configuration of Second Embodiment>

Figure 3:
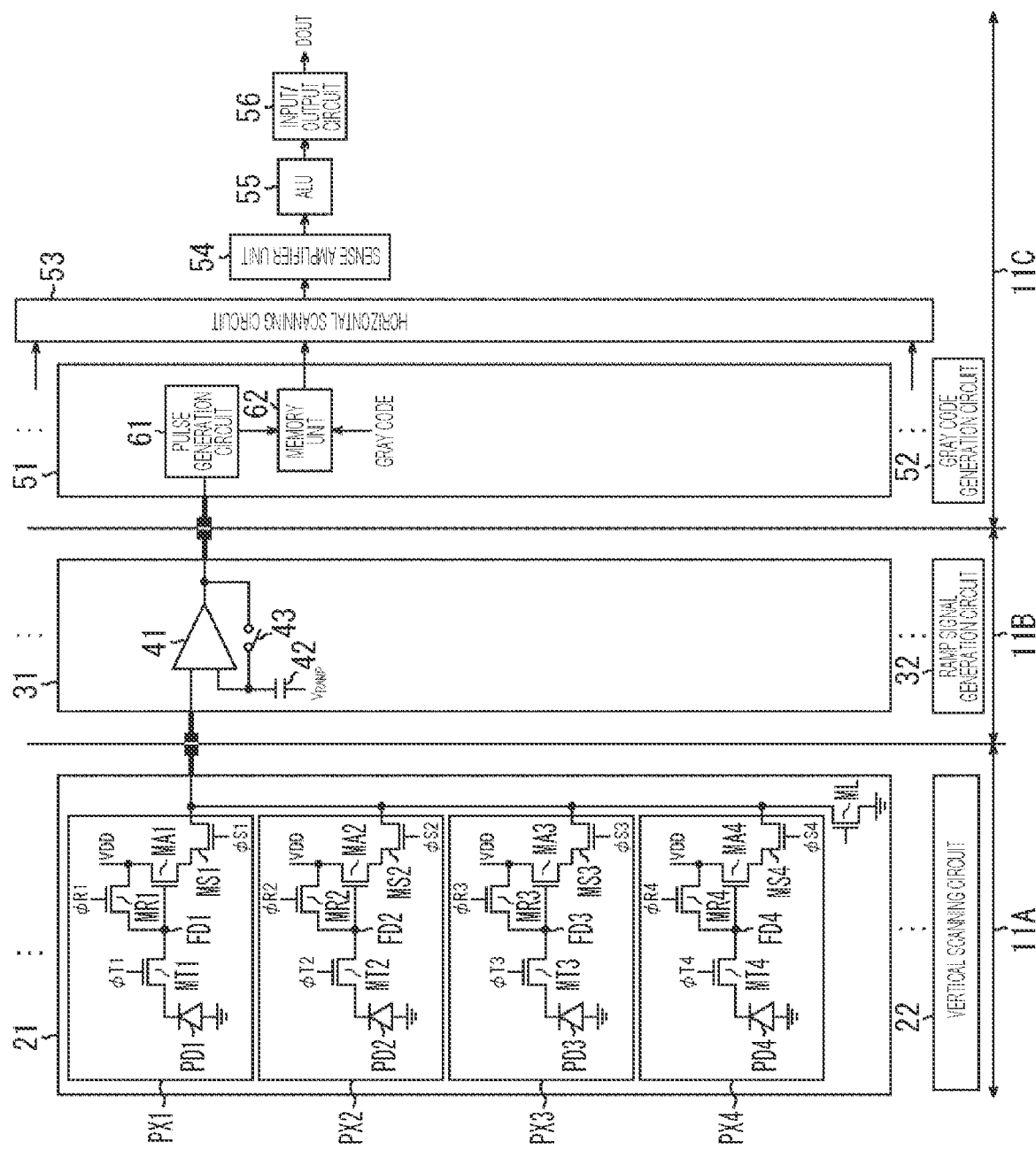
FIG. 3 is a diagram illustrating a circuit configuration of the solid-state image capturing device illustrated in FIG. 1, according to a second embodiment.

FIG. 3 illustrates a circuit configuration of the solid-state image capturing device 1 including the three-layer substrate 11, according to a second embodiment.

In FIG. 3, the parts corresponding to those of the first embodiment illustrated in FIG. 2 are designated by the same reference numerals, and the description of the parts will be omitted as appropriate.

The configuration of the pixel block 21 of the first substrate 11A according to the second embodiment illustrated in FIG. 3 is different from that of the first embodiment illustrated in FIG. 2, and other configurations are common to those of the first embodiment illustrated in FIG. 2.

In the first embodiment illustrated in FIG. 2, the photodiode PD and the transfer transistor MT are provided for each pixel PX, whereas the floating diffusion FD, the reset transistor MR, the amplification transistor MA, and the load transistor ML are provided for each pixel block 21.

On the other hand, in the pixel blocks 21 of the second embodiment, the photodiode PD, the transfer transistor MT, the floating diffusion FD, the reset transistor MR, the amplification transistor MA, and a select transistor MS are provided for each pixel PX, and only the load transistor ML is provided for each pixel block 21.

More specifically, for example, the pixel PX1 includes the photodiode PD1, the transfer transistor MT1, a floating diffusion FD1, a reset transistor MR1, an amplification transistor MA1, and a select transistor MS1. The pixel PX2 includes the photodiode PD2, the transfer transistor MT2, a floating diffusion FD2, a reset transistor MR2, an amplification transistor MA2, and a select transistor MS2. The same holds for the pixels PX3 and PX4.

The select transistor MS is not present in the pixel PX of the first embodiment, but is newly added to the pixel PX of the second embodiment. The select transistor MS is brought into a conductive state when the pixel PX is selected by a select signal φS, and outputs the pixel signal Vsig of the pixel PX to the second substrate 11B. The select signal φS is also controlled by the vertical scanning circuit 22.

In the first embodiment, the pixel signal Vsig of each pixel PX is output to the comparator 41 of the second substrate 11B when the transfer transistor MT is brought into a conductive state (ON), and the transfer transistors MT of four pixels PX in the pixel block 21 need to be turned on in order. Consequently, the exposure time slightly varies in these four pixels PX.

On the other hand, in the second embodiment, since the output of the pixel signal Vsig to the comparator 41 is switched by the select transistor MS, the timing of turning on the transfer transistor MT can be the same for the pixels PX1 to PX4.

As a result, in the second embodiment, it is possible to achieve a complete global shutter operation in which the exposure time is the same for all pixels of the pixel array.

Further, also in the circuit configuration of the second embodiment, the circuits are separately arranged on three substrates 11 as in the first embodiment, and thus a large area for forming the comparator 41 can be secured and the noise can be reduced.

<4. Circuit Configuration of Third Embodiment>

Figure 4:
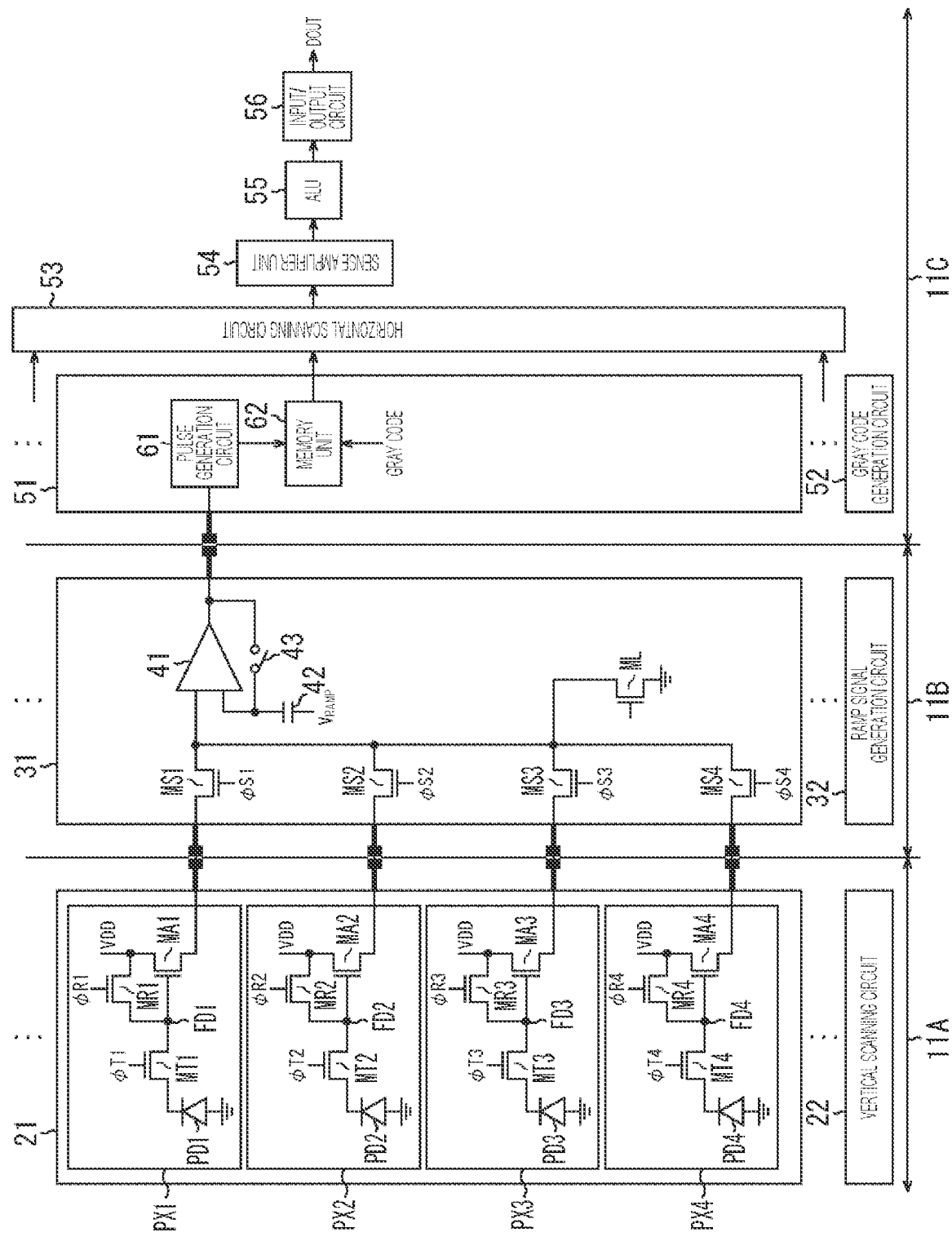
FIG. 4 is a diagram illustrating a circuit configuration of the solid-state image capturing device illustrated in FIG. 1, according to a third embodiment.

FIG. 4 illustrates a circuit configuration of the solid-state image capturing device 1 including the three-layer substrate 11, according to a third embodiment.

In FIG. 4, the parts corresponding to those of the first and second embodiments described above are designated by the same reference numerals, and the description of the parts will be omitted as appropriate.

The third embodiment illustrated in FIG. 4 is common to the second embodiment illustrated in FIG. 3 in that the photodiode PD, the transfer transistor MT, the floating diffusion FD, the reset transistor MR, the amplification transistor MA, and the select transistor MS are provided for each pixel PX, and only the load transistor ML is provided for each pixel block 21.

However, the third embodiment illustrated in FIG. 4 is different from the second embodiment illustrated in FIG. 3 in that the select transistor MS for each pixel PX and the load transistor ML for each pixel block 21, which are arranged on the first substrate 11A in the second embodiment, are arranged on the second substrate 11B.

In other words, the third embodiment illustrated in FIG. 4 is configured by moving the select transistor MS and the load transistor ML of the second embodiment illustrated in FIG. 3 to the second substrate 11B.

By moving the select transistor MS and the load transistor ML to the second substrate 11B in this way, the number of elements in the pixel PX is reduced. Consequently, the photodiode PD can be formed larger and the number of saturated electrons can be increased as compared with the second embodiment.

Further, also in the circuit configuration of the third embodiment, the circuits are separately arranged on the three substrates 11 as in the frst embodiment, and thus a large area for forming the comparator 41 can be secured and the noise can be reduced.

<5, Circuit Configuration of Fourth Embodiment>

Figure 5:
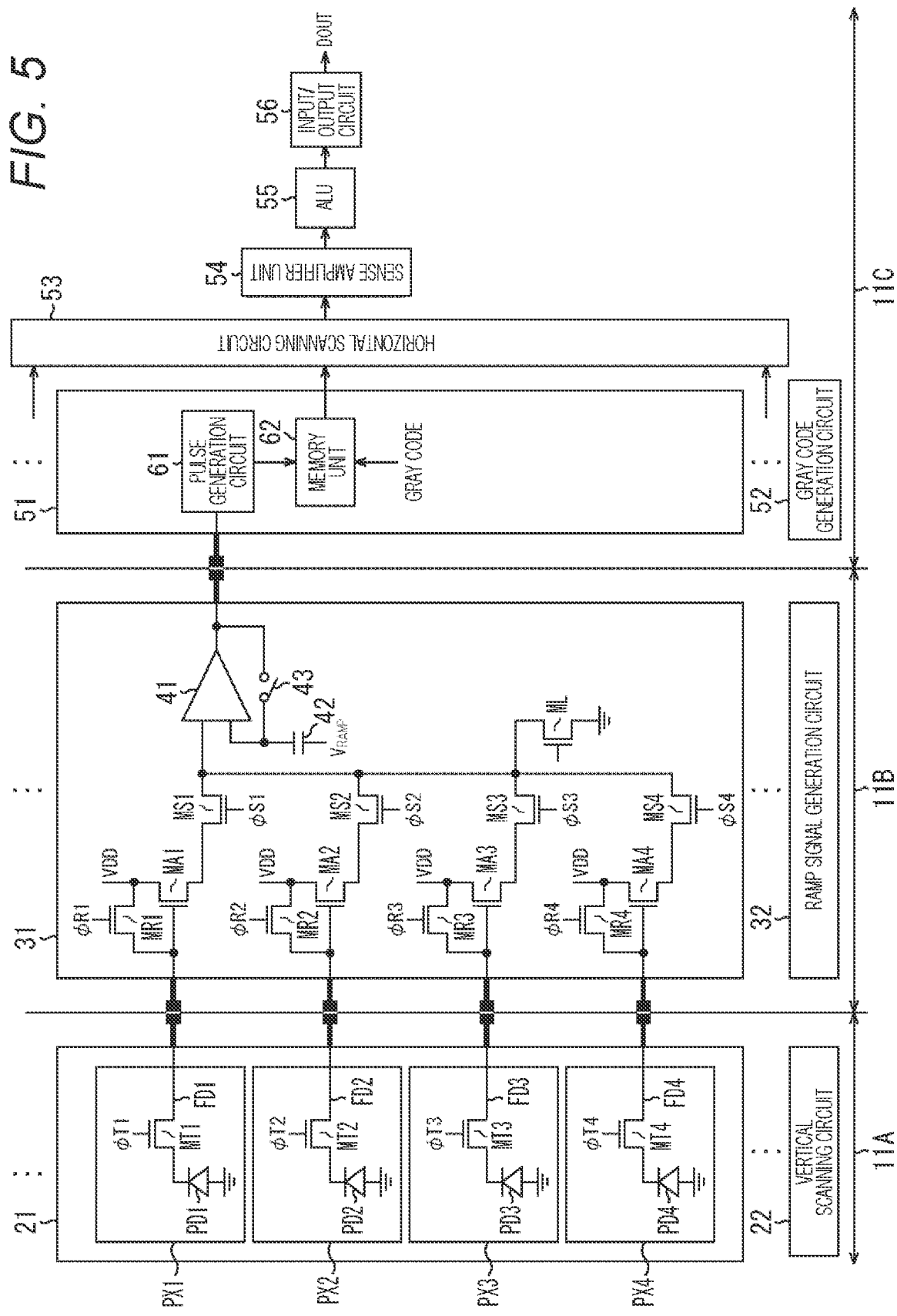
FIG. 5 is a diagram illustrating a circuit configuration of the solid-state image capturing device illustrated in FIG. 1, according to a fourth embodiment.

FIG. 5 illustrates a circuit configuration of the solid-state image capturing device 1 including the three-layer substrate 11, according to a fourth embodiment.

In FIG. 5, the parts corresponding to those of the first to third embodiments described above are designated by the same reference numerals, and the description of the parts will be omitted as appropriate.

The fourth embodiment illustrated in FIG. 5 is common to the second embodiment illustrated in FIG. 3 in that the photodiode PD, the transfer transistor MT, the floating diffusion FD, the reset transistor MR, the amplification transistor MA, and the select transistor MS are provided for each pixel PX, and only the load transistor ML is provided for each pixel block 21.

However, the fourth embodiment illustrated in FIG. 5 is different from the second embodiment illustrated in FIG. 3 in that the reset transistor MR, the amplification transistor MA, and the select transistor MS, and the load transistor ML for each pixel block 21 are arranged on the second substrate 11B, and the floating diffusion FD is formed on both the first substrate 11A and the second substrate 11B so as to electrically connect these two substrates.

In other words, the fourth embodiment illustrated in FIG. 5 is configured by moving the reset transistor MR, the amplification transistor MA, and the select transistor MS of the second embodiment illustrated in FIG. 3 to the second substrate 11B.

Compared with the third embodiment illustrated FIG. 4, the fourth embodiment illustrated in FIG. 5 is configured by moving the reset transistor MR and the amplification transistor MA to the ADC analog block 31 of the second substrate 11B. As a result of moving these transistors to the ADC analog block 31 of the second substrate the ADC analog block 31 arranged on the second substrate 11B in a one-to-one correspondence with the pixel block 21 is not only an ADC analog circuit but also an analog circuit block that also includes a plurality of pixel transistors. Hereinafter, the ADC analog block 31 is also referred to as "analog circuit block 31".

As the reset transistor MR, the amplification transistor MA, the select transistor MS, and the load transistor ML are moved to the second substrate in in this way, only the photodiode PD, the transfer transistor MT, and the floating diffusion FD are elements provided for each pixel PX on the first substrate 11A. As a result, the number of saturated electrons in the photodiode PD can be further increased, and the sensitivity can be improved.

Further, also in the circuit configuration of the fourth embodiment, the circuits are separately arranged on three substrates 11 as in the first embodiment, and thus a large area for forming the comparator 41 can be secured and the noise can be reduced.

Further, in the circuit configuration of the fourth embodiment, the number of transistors provided on the first substrate 11A is small, that is, only the transfer transistor MT is provided, as compared with the other embodiments. For this reason, in a case where the transfer transistor MT is arranged in a pixel, the degree of freedom the layout is higher as compared with other embodiments. As a result, for example, it is possible to achieve an effect that a layout that further improves the characteristics of pixels can be used.

<Modification of Fourth Embodiment>

Figure 6:
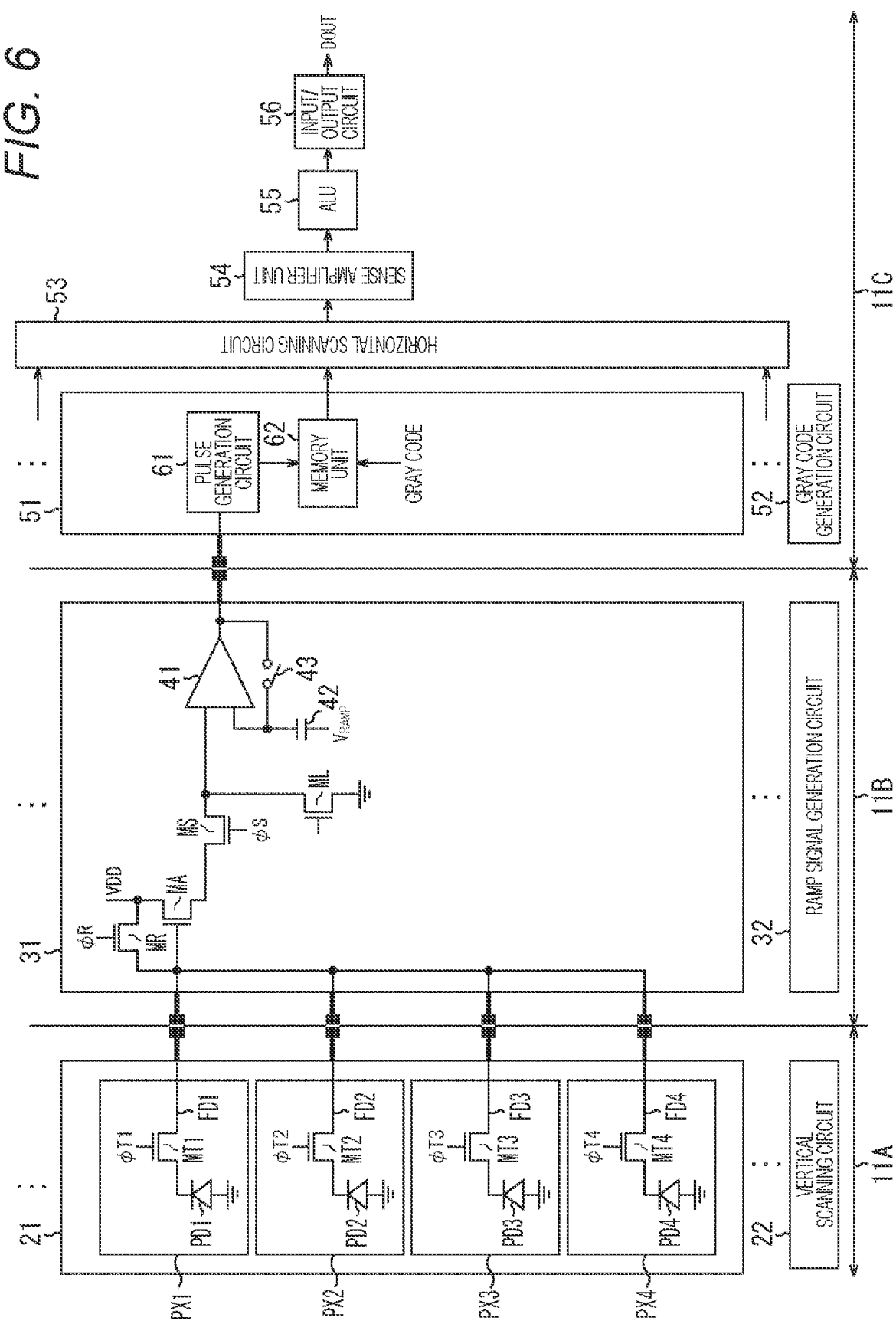
FIG. 6 is a diagram illustrating a circuit configuration of a first modification of the fourth embodiment.

FIG. 6 illustrates a first modification of the fourth embodiment.

The first modification illustrated in FIG. 6 is different from the fourth embodiment illustrated in FIG. 5 in the circuit configuration of the analog circuit block 31. The floating diffusion FD for each pixel is connected from the first substrate 11A to the second substrate 11B, but in the first modification, the floating diffusions FD are connected to each other in the second substrate 11B. In addition, a set of pixel transistors (reset transistor MR, amplification transistor MA, and select transistor MS) and the load transistor ML are connected to the floating diffusions FD, which are connected to each other, in the analog circuit block 31. Consequently, a set of pixel transistors (reset transistor MR, amplification transistor MA, and select transistor MS) and the load transistor ML are shared by a plurality of pixels PX. The output of the amplification transistor MA is input to the comparator 41 via the select transistor MS. In the first modification, the number of transistors included in the analog circuit block 31 is smaller than that in the fourth embodiment illustrated in FIG. 5, and thus a larger area for forming the comparator 41 can be secured, and the noise of the comparator 41 can be reduced.

Figure 7:
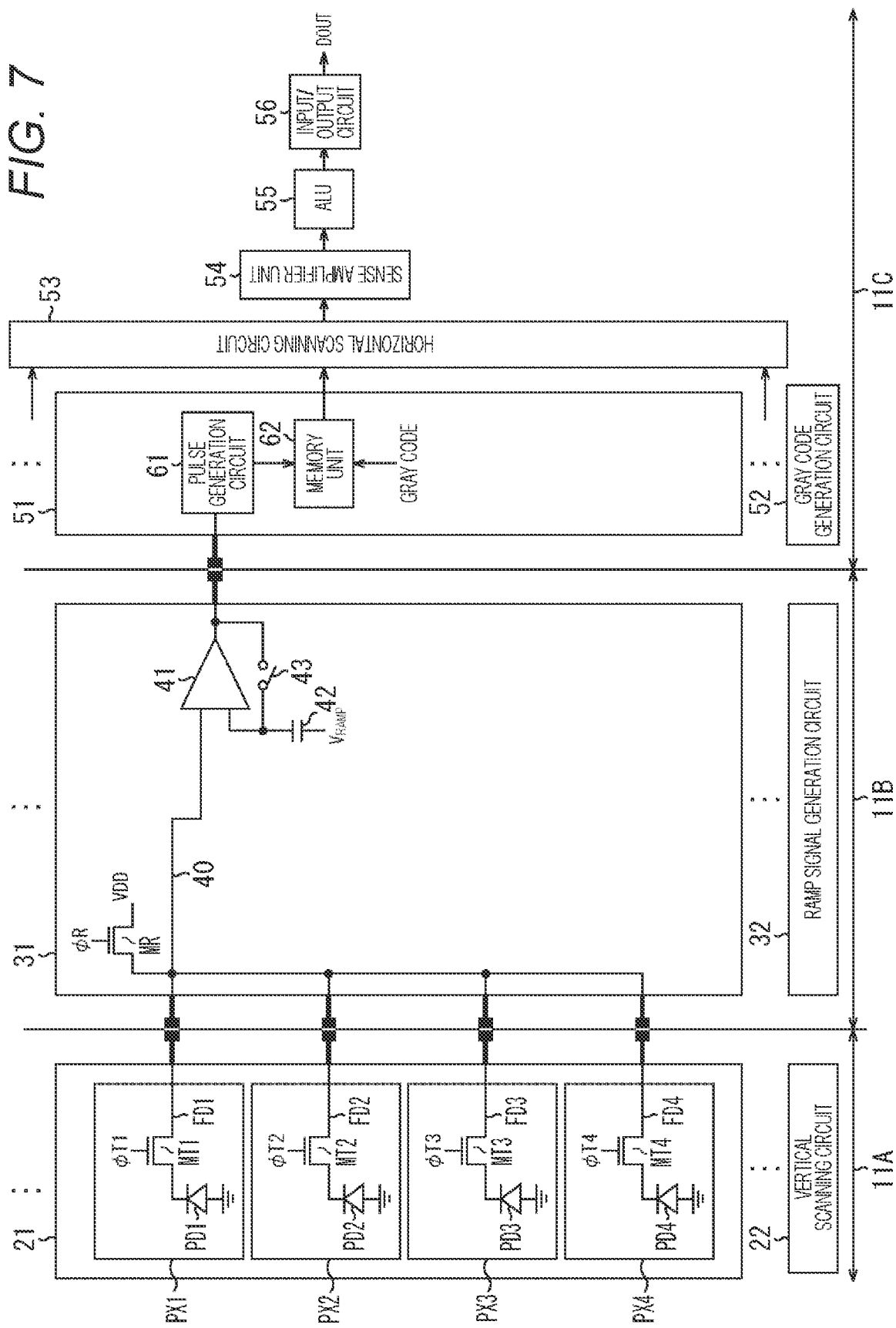
FIG. 7 as a diagram illustrating a circuit configuration of a second modification of the fourth embodiment.

FIG. 7 illustrates a second modification of the fourth embodiment.

The second modification illustrated in FIG. 7 is different from the first modification illustrated in FIG. 6 in the circuit configuration of the analog circuit block 31. The floating diffusion FD for each pixel is connected from the first substrate 11A to the second substrate 11B, but in the second modification, the floating diffusions FD are connected to each other in the second substrate 11B. The floating diffusions FD connected to each other are then connected to one common wire 40, and the common wire 40 is connected to the comparator 41 without an active element. The reset transistor MR is also connected to the common wire 40 and the floating diffusions FD. In the second modification, the number of transistors included in the analog circuit block 31 is much smaller than that in the first modification, and thus a much larger area for forming the comparator 41 can be secured, and the noise of the comparator 41 can be further reduced.

Figure 8:
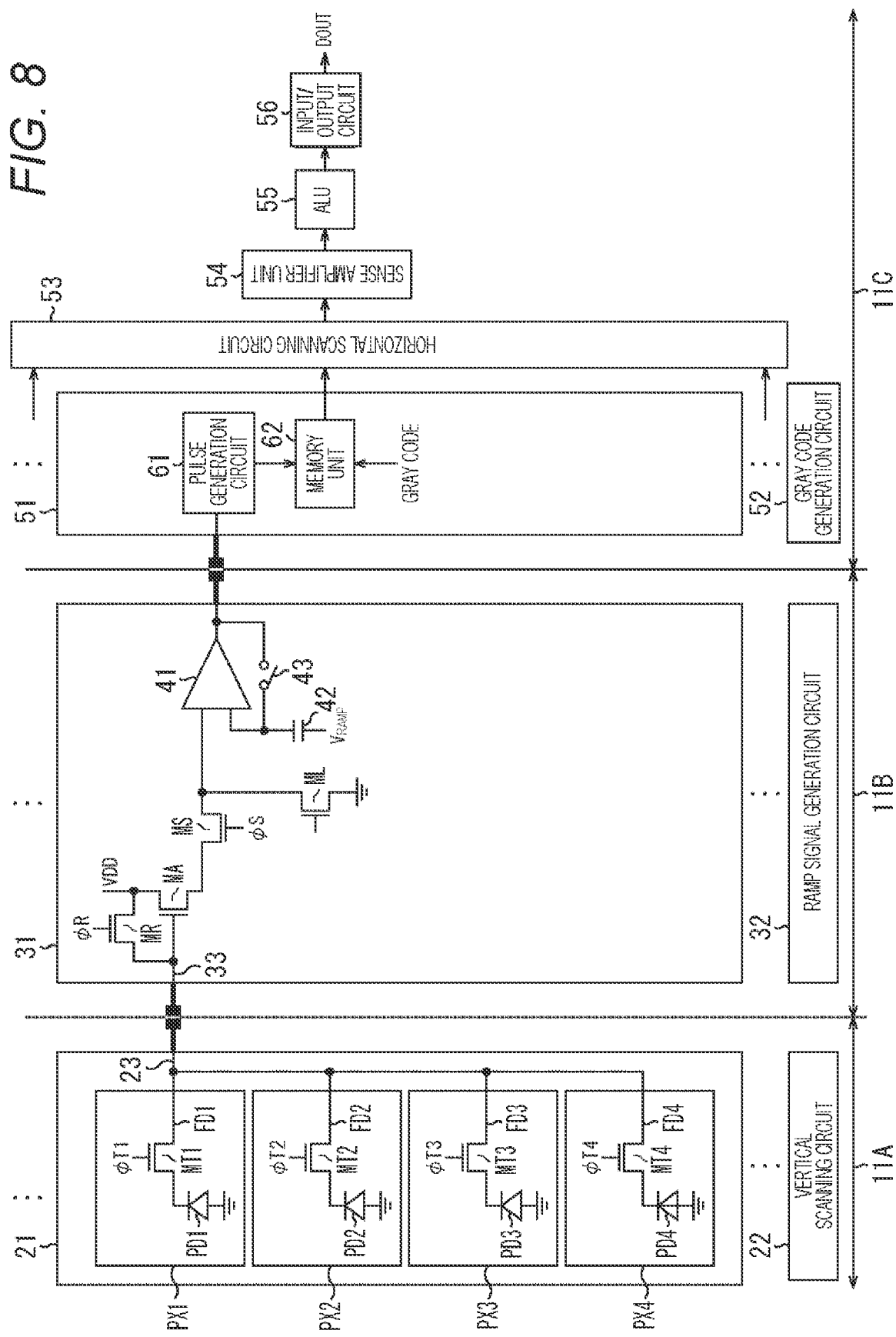
FIG. 8 is a diagram illustrating a circuit configuration of a third modification of the fourth embodiment.

FIG. 8 illustrates a third modification of the fourth embodiment.

The third modification illustrated in FIG. 8 is different from the first modification illustrated in FIG. 6 in the configuration of the floating diffusion FD. In the third modification, the floating diffusions FD, which are provided for each of pixels, are connected to each other by a common wire 23 in the first substrate 11A. In addition, the common wire 23 of the first substrate 11A to which the floating diffusions FD are connected is connected to a wire 33 of the second substrate 11B, and then to a set of pixel transistors (reset transistor MR, amplification transistor MA, and select transistor MS) and the load transistor ML in the analog circuit block 31 of the second substrate 11B. Consequently, a set of pixel transistors (reset transistor MR, amplification transistor MA, and select transistor MS)) and the load transistor ML are shared by a plurality of pixels PX. The output of the amplification transistor MA is input to the comparator 41 via the select transistor MS. In the third modification, the number of floating diffusions FD connected from the first substrate 11A to the second substrate 11B is smaller than that in the first modification, and thus the parasitic capacitance of the floating diffusion FD is reduced. As a result, it is possible to obtain a signal with a high conversion gain (output voltage obtained when one electric charge is converted into voltage) in the floating diffusion FD and a high SN ratio.

Figure 9:
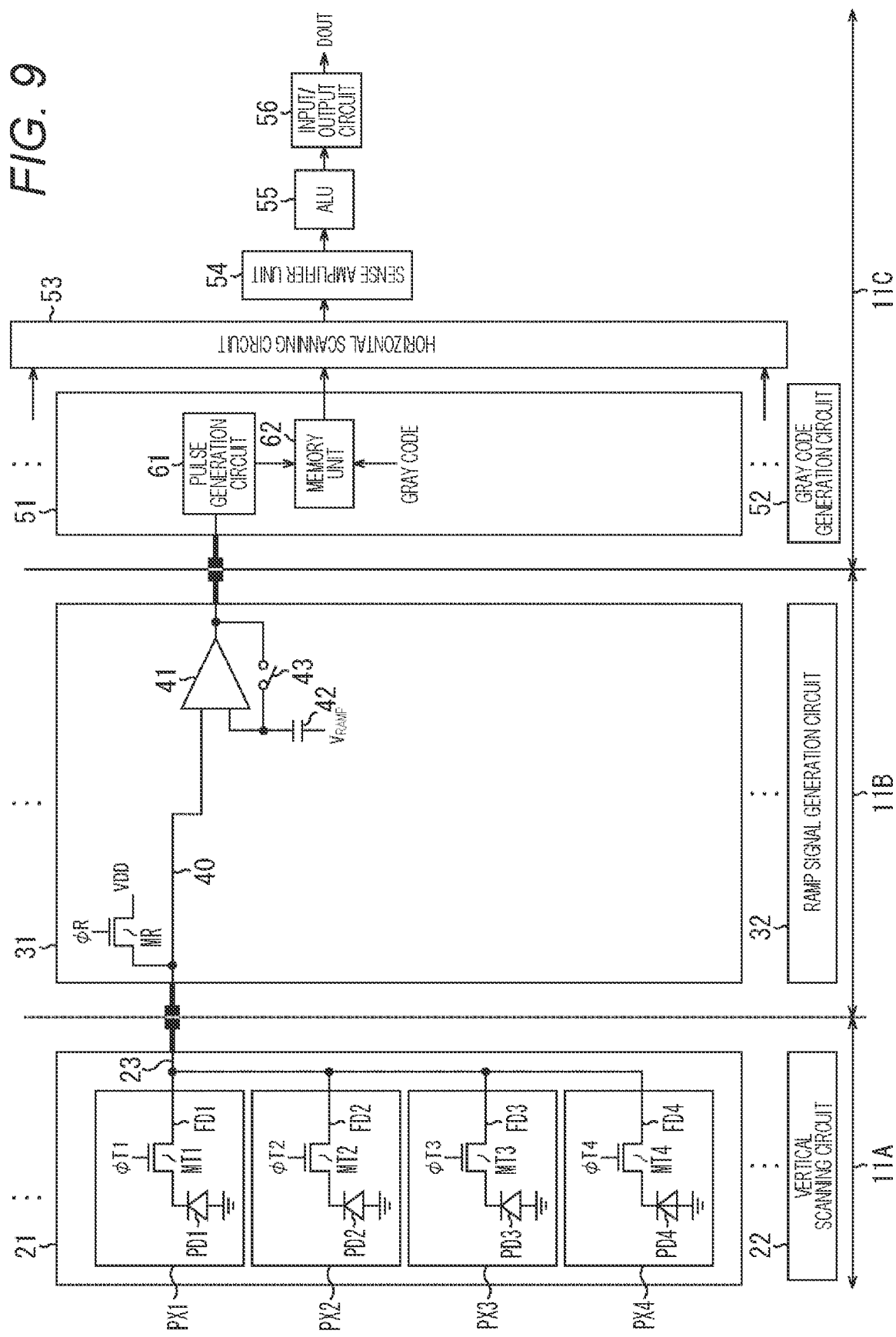
FIG. 9 is a diagram illustrating a circuit configuration of a fourth modification of the fourth embodiment.

FIG. 9 illustrates a fourth modification of the fourth embodiment.

The fourth modification illustrated in FIG. 9 is different from the third modification illustrated in FIG. 8 in the circuit configuration of the analog circuit block 31. In the fourth modification, the floating diffusions FD, which are provided for each of pixels, are connected to each other by the common wire 23 in the first substrate 11A. The common wire 23 of the first substrate 11A to which the floating diffusions FD are connected is then connected to one common wire 40 of the second substrate 11B. This one common wire 40 is then connected to the comparator 41 without an active element. The reset transistor MR is also connected to the common wire 40. In the fourth modification, the number of transistors included in the analog circuit block 31 is much smaller than that in the third modification, and thus a much larger area for forming the comparator 41 can be secured, and the noise of the comparator 41 can be further reduced.

<6. Circuit Configuration of Fifth Embodiment>

Figure 10:
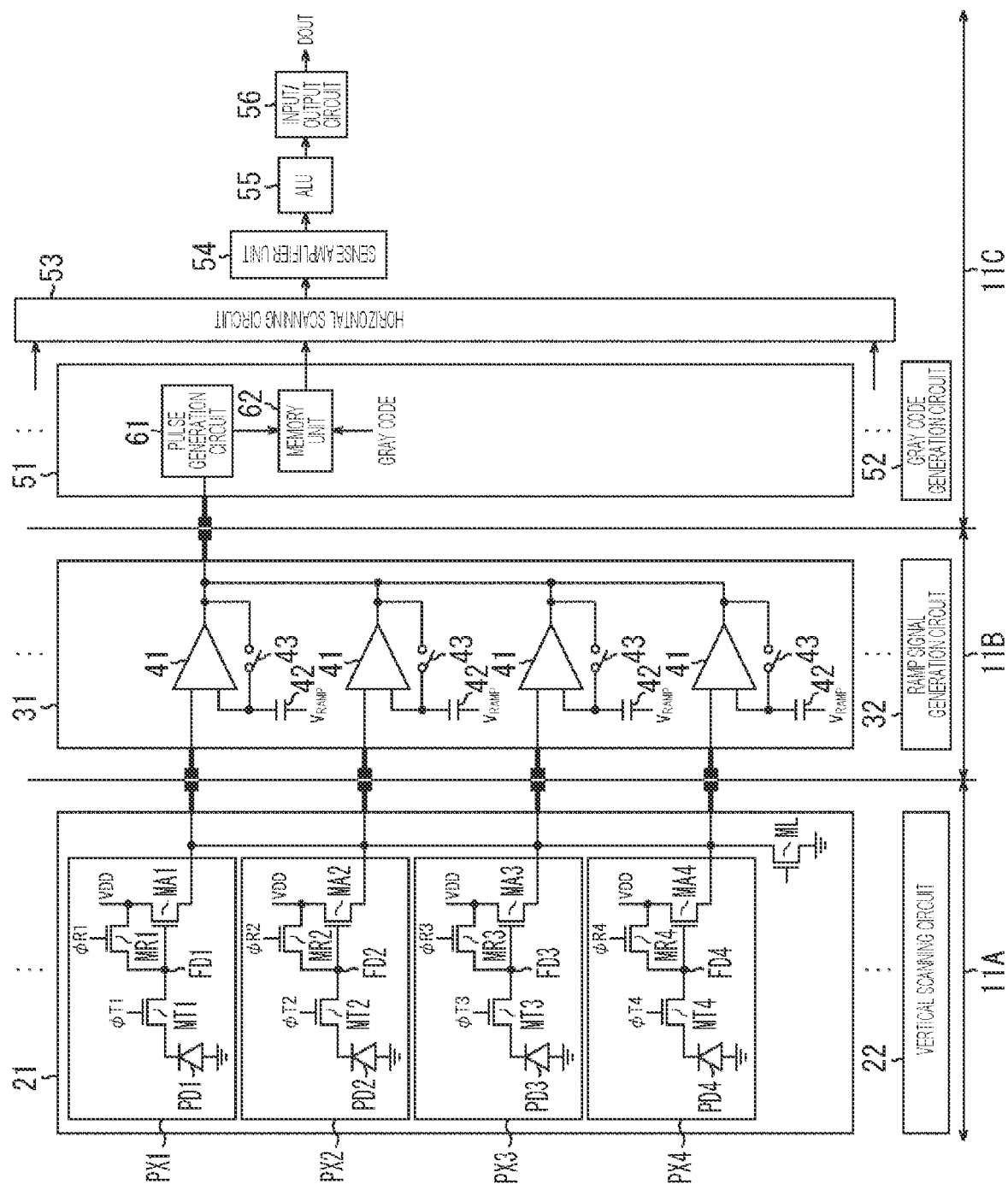
FIG. 10 is a diagram illustrating a circuit configuration of the solid-state image capturing device illustrated in FIG. 1, according to a fifth embodiment.

FIG. 10 illustrates a circuit configuration of the solid-state image capturing device 1 including the three-layer substrate 11, according to a fifth embodiment.

In FIG. 10, the parts corresponding to those of the first to fourth embodiments described above are designated by the same reference numerals, and the description of the parts will be omitted as appropriate.

The fifth embodiment illustrated in FIG. 10 is common to the second embodiment illustrated in FIG. 3 in that, in the first substrate 11A, the photodiode PD, the transfer transistor MT, the floating diffusion FD, the reset transistor MR, and the amplification transistor MA are provided for each pixel PX, and only the load transistor ML is provided for each pixel block 21.

On the other hand, the fifth embodiment illustrated in FIG. 10 is different from the second embodiment illustrated in FIG. 3 in that the comparator 41, the capacitor 42, and the switch 43 are provided for each pixel PX in the ADC analog block 31 of the second substrate 11B. Consequently, in the fifth embodiment illustrated in FIG. 10, four sets of the comparator 41, the capacitor 42, and the switch 43 are provided in the ADC analog block 31.

Since the pixel PX in the first substrate 11A is in a one-to-one correspondence with the comparator 41 in the second substrate 11B and thus the select transistor MS is not required for each pixel PX, the select transistor MS is omitted in the fifth embodiment illustrated in FIG. 10.

<7. First Configuration Example of Third Substrate>

The first to fifth embodiments have mainly described the detailed configurations of the first substrate 11A and the second substrate 11B. Next, the detailed configuration of the third substrate 11C will be described.

Figure 11:
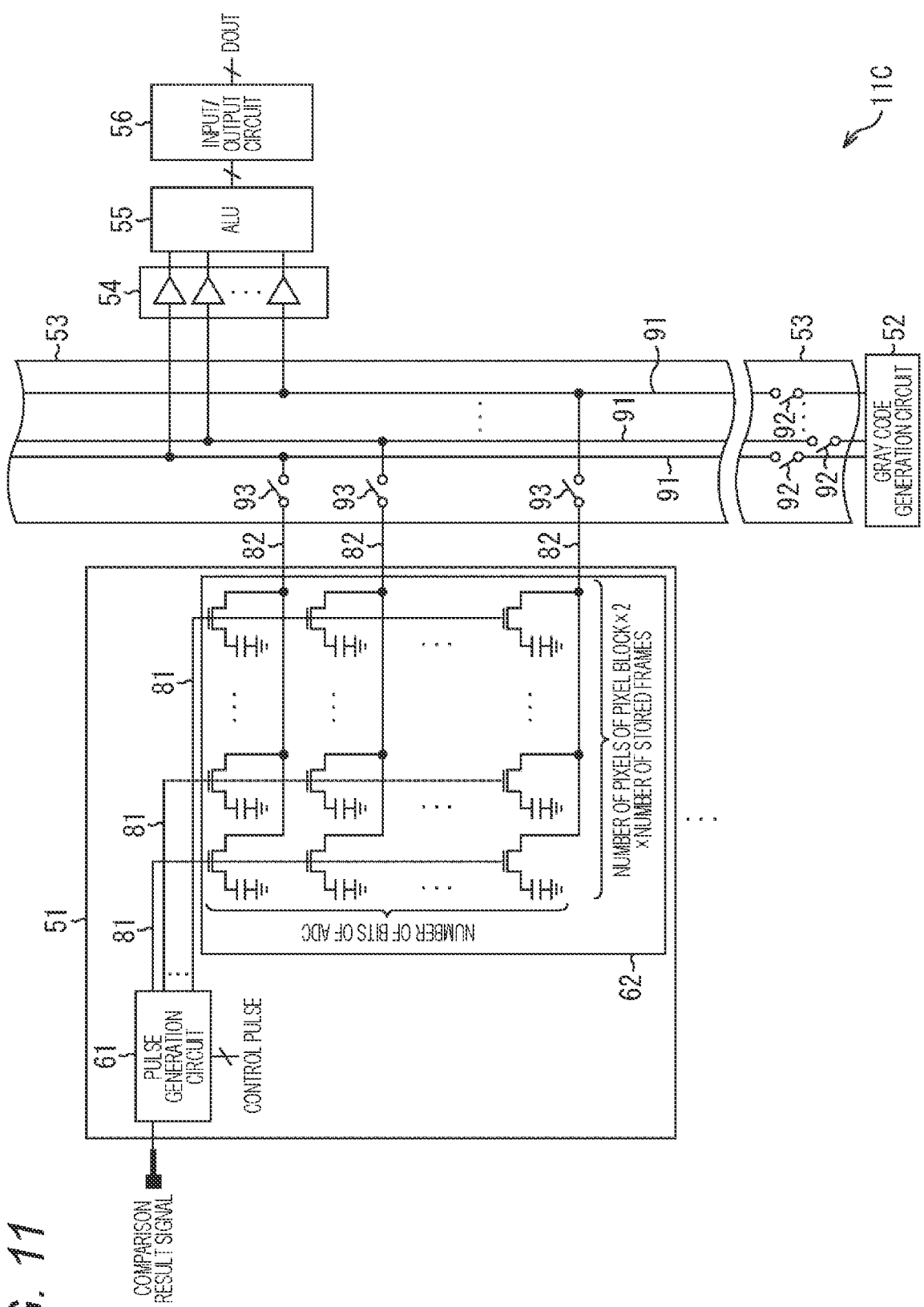
FIG. 11 is a diagram illustrating a first configuration example of a third substrate.

FIG. 11 illustrates a first configuration example of the third substrate 11C.

The ADC digital memory block 51 includes the pulse generation circuit 61 and the memory unit 62. The memory unit 62 is configured by, for example, a dynamic read only memory (DRAM). Each cell in the DRAM is configured by a MOS transistor and a capacitor, or three MOS transistors.

The pulse generation circuit 61 generates a pulse according to the inversion timing of a comparison result signal that is the output of the comparator 41, and supplies the pulse to a predetermined word line 81 of the DRAM that is the memory unit 62.

One word of the DRAM of the memory unit 62 matches the number of conversion bits of the ADC, and the number of words matches twice the number of pixels constituting the pixel block 21. In a case where the memory unit 62 stores pixel signals of a plurality of frames, the number of words is obtained by multiplying the number of pixels by 2 and then multiplying the result by the number of frames. Specifically, assuming that the number of pixels in the pixel block 21 is denoted by $N_P$, the number of conversion bits of the ADC is denoted by $N_{ADC}$, and the number of frames stored in the memory unit 62 is denoted by $N_{FRM}$, the memory unit 62 is configured by $N_P \times N_{ADC} \times N_{FRM} \times 2$ bits. The reason why the number of words is double the number of pixels is that both a reset level signal and an optical signal are stored at the same time.

Note that the number of conversion bits of a 1-word ADC for the reset level signal may be less than the number of conversion bits of the 1-word ADC for the optical signal by several bits. For example, assuming that the difference in the number of bits between the optical signal and the reset level signal is denoted by $N_{REM}$ and the number of redundant bits required for calculation is denoted by $N_{ALU}$, the memory unit 62 is configured by $N_P \times N_{ADC} \times ((N_{FRM}+N_{ALU}) \times 2 - N_{REM})$ bits.

The memory unit 62 stores the Gray code supplied from the Gray code generation circuit 52 via a bit line 82 at the timing when the pulse is supplied from the pulse generation circuit 61. Further, the memory unit 62 outputs a stored Gray code to the sense amplifier unit 54 via the bit line 82 according to the control of the horizontal scanning circuit 53.

The horizontal scanning circuit 53 has a plurality of bus lines 91, and switches 92 and 93 as many as the respective bus lines 91. The horizontal scanning circuit 53 controls the switches 92 and 93 to supply the Gray code generated by the Gray code generation circuit 52 to the memory unit 62. Further, the horizontal scanning circuit 53 controls the switches 93 to output the Gray code stored in the memory unit 62 to the sense amplifier unit 54.

The sense amplifier unit 54 amplifies the Gray code (signal) of each of the reset level signal and the optical signal supplied from the memory unit 62 via the horizontal scanning circuit 53, and outputs the Gray code to the ALU 55.

The ALU55 converts two Gray codes corresponding to a reset level signal and an optical signal into binary codes, and performs a CDS calculation of subtracting the reset level signal from the optical signal.

The input/output circuit 56 outputs a pixel signal of each pixel PX subjected to the CDS calculation to the outside of the device.

The first configuration example of the third substrate 11C is configured as described above.

It should be noted that in FIG. 11, the DRAM, which is the memory unit 62, is scanned one-dimensionally due to space limitations, but the DRAM, is generally developed in two dimensions, and the horizontal scanning circuit 53 can perform two-dimensional scanning.

<8. Second Configuration Example of Third Substrate>.

Figure 12:
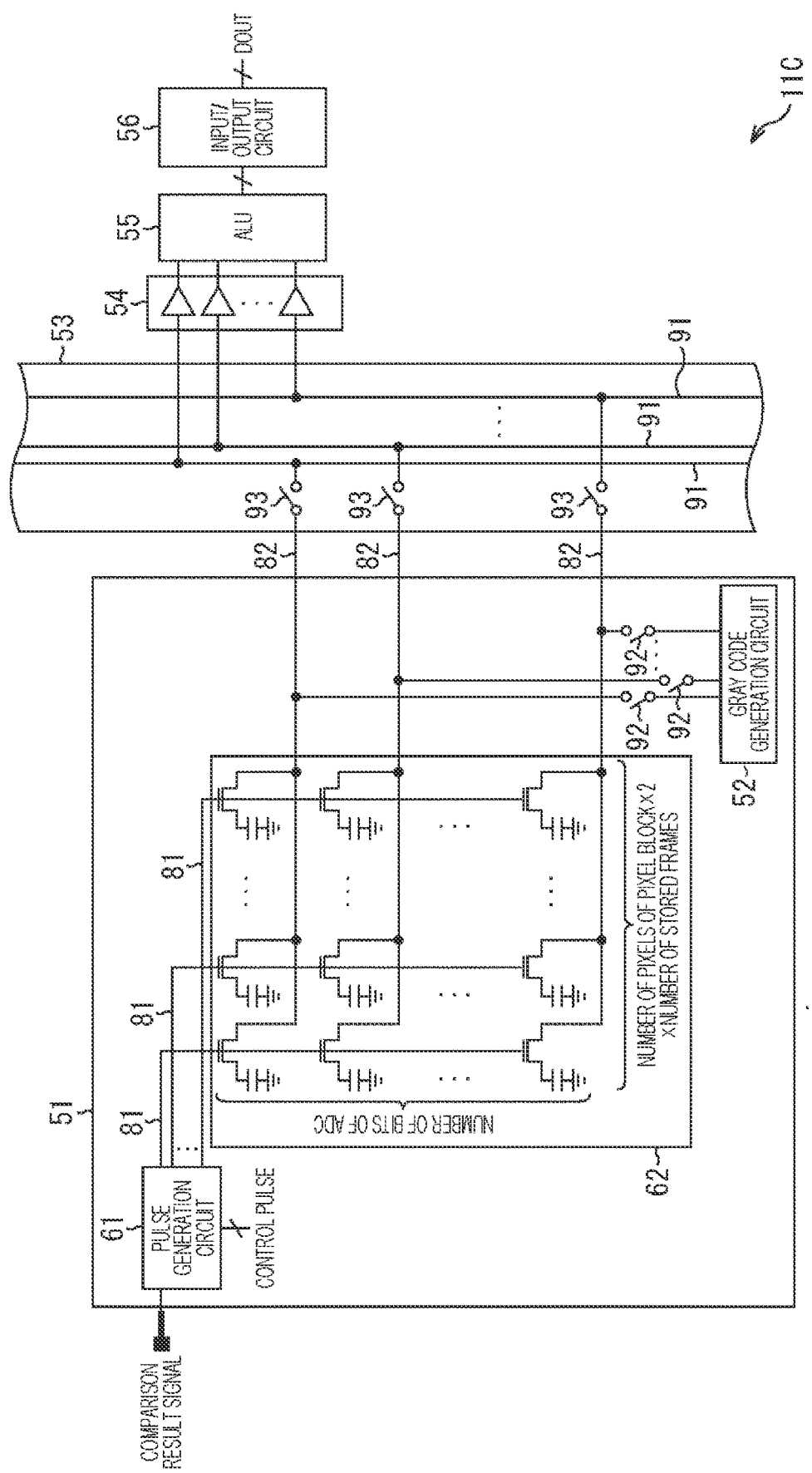
FIG. 12 is a diagram illustrating a second configuration example of the third substrate.

FIG. 12 illustrates a second configuration example of the third substrate 11C.

In FIG. 12, the parts corresponding to those of the first configuration example illustrated in FIG. 11 are designated by the same reference numerals, and the description of the parts will be omitted as appropriate.

The second configuration example of the third substrate 11C is different from the first configuration example illustrated in FIG. 11 in the arrangement of the Gray code generation circuit 52.

That is, the Gray code generation circuit 52 is provided separately from a plurality of the ADC digital memory blocks 51 and the horizontal scanning circuit 53 in the first configuration example illustrated in FIG. 11, but in the second configuration example illustrated in FIG. 12, the Gray code generation circuit 52 is provided in the ADC digital memory block 51. Consequently, in the second configuration example, the Gray code generation circuit 52 is provided in each of a plurality of the ADC digital memory blocks 51 as one configuration of the ADC digital memory block 51 in other words, the Gray code generation circuit 52 is shared by all the ADC digital memory blocks 51 in the first configuration example, whereas the Gray code generation circuit 52 is provided for each ADC digital memory block 51 in the second configuration example. Further, as the Gray code generation circuit 52 is moved, the switch 92 is also moved in the ADC digital memory block 51, and the Gray code generation circuit 52 and the bit line 82 are connected via the switch 92.

The second configuration example of the third substrate 11C is configured as described above.

By providing the Gray code generation circuit 52 for each ADC digital memory block 51 as in the second configuration example, it is possible to reduce the wiring delay due to the bus line 91 and the power consumption due to the parasitic capacitance of the bus line 91. On the other hand, in a case where the Gray code generation circuit 52 is shared by all the ADC digital memory blocks 51 as in the first configuration example, only one Gray code generation circuit 52 is sufficient, so that the total number of elements can be reduced.

Further, in a case where the Gray code generation circuit 52 is provided for each ADC digital memory block 51 as in the second configuration example, a digital double correlation sampling (digital CDS) process can be performed. Here, in the digital CDS process, first, the Gray code is counted down and at the same time the magnitude of a reset level signal is detected, and the Gray code is counted up by using the Gray code count value when the magnitude of the reset level signal is detected as a starting point, and at the same time the magnitude of an optical signal is detected. In a case of using this method, the Gray code count value at the time when the magnitude of the optical signal is detected is the value obtained by subtracting the magnitude of the reset level signal from the magnitude of the optical signal, and thus it is not necessary to have the ALU 55 separately in order to subtract the magnitude of the reset level signal from the magnitude of the optical signal. This makes it possible to use the configuration in which the ALU 55 is removed from the configuration illustrated in FIG. 12.

Note that one Gray code generation circuit 52 is provided for one ADC digital memory block 51 in the second configuration example, but one Gray code generation circuit 52 may be provided for a plurality of the ADC digital memory blocks 51.

<9. Third configuration Example of Third Substrate>

Figure 13:
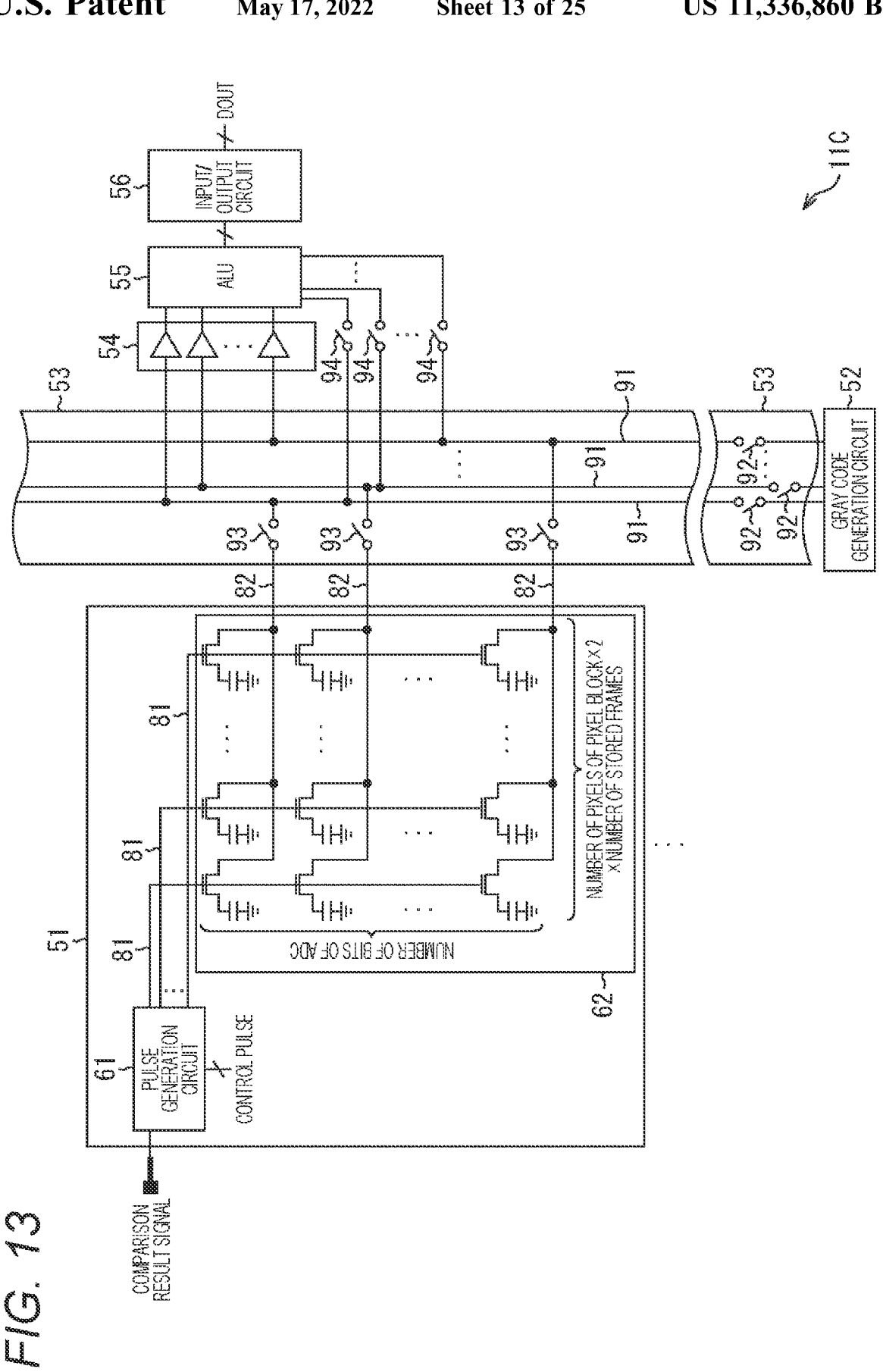
FIG. 13 is a diagram illustrating a third configuration example of the third substrate.

FIG. 13 illustrates a third configuration example of the third substrate 11C.

In FIG. 13, the parts corresponding to those of the first configuration example illustrated in FIG. 11 are designated by the same reference numerals, and the description of the parts will be omitted as appropriate.

The third configuration example of the third substrate 11C is a configuration in which a switch 94 that connects the ALU 55 and a predetermined bus line 91 is further added to the first configuration example illustrated in FIG. 11. Each switch 94 that connects the bus line 91 and the ALU 55 is controlled by, for example, the horizontal scanning circuit 53.

In a case where the memory unit 62 can store signals of a plurality of frames, when the switch 94 is turned on, the pixel signal subjected to the calculation in the ALU 55 can be returned to the memory unit 62 and stored in the memory unit 62. This third configuration example is effective in a case where the calculation is performed on a plurality of frames, for example, pixel signals are subtracted between frames to calculate motion vector data.

<10. Example of Cross-Sectional Structure of Pixel Array>

Figure 14:
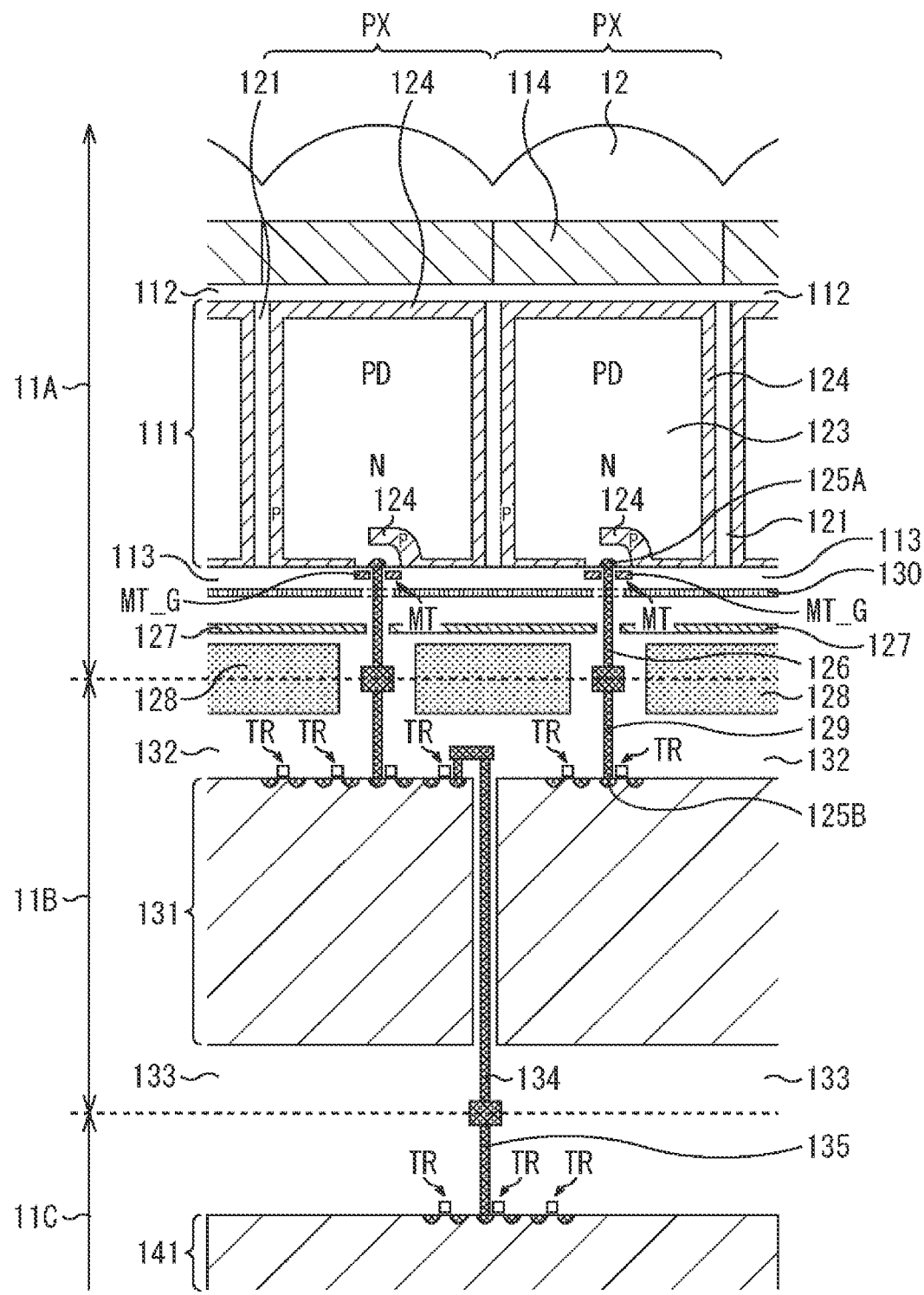
FIG. 14 is a diagram illustrating an example of a cross-sectional structure of a pixel array.

FIG. 14 is a diagram illustrating an example of a cross-sectional structure of a pixel array in the solid-state image capturing device 1.

FIG. 14 illustrates a cross-sectional structure corresponding to the circuit configuration of the fourth embodiment illustrated in FIG. 5, that is, the configuration in which the photodiode PD, the transfer transistor MT, and the floating diffusion FD are formed on the first substrate 11A, the reset transistor MR, the amplification transistor MA, the select transistor MS and the load transistor ML are formed on the second substrate 11B.

In the first substrate 11A, insulating films 112 and 113 are formed on a back surface side and a front surface side of a semiconductor substrate 111, respectively, using, for example, silicon (Si) or the like as a semiconductor. A color filter 114 and the microlens 12 are formed in this order on an upper side of the insulating film 112 on the back surface side of the semiconductor substrate 111. The back surface side of the semiconductor substrate 111 on which the microlens 12 is formed is a light incident side. Consequently, the solid-state image capturing device 1 is a back-side illumination solid-state image capturing device.

For example, silicon oxide (SiO2) or the like is used as the material of the insulating films 112 and 113. In addition to the insulating film 112, a reflection prevention film, a fixed charge film, or the like that contains silicon nitride (SiN), hafnium oxide (HfO2), or the like may be formed on the light incident side of the semiconductor substrate 111.

The color filter 114 has, for example, a Bayer array of red (R), green (G), or blue (B). The color filter 114 is formed by rotationally applying a photosensitive resin containing a coloring matter such as a pigment or a dye, for example. The microlens 12 is formed with, for example, a resin-based material such as a styrene-based resin, an acrylic-based resin, a styrene-acrylic copolymer-based resin, or a siloxane-based resin.

In the semiconductor substrate 111, a deep trench isolation (DTI) 121 that electrically separates adjacent pixels from each other is formed with an insulating film such as silicon oxide (SiO2) at the boundary portion of the pixels PX. In addition, the photodiode PD including an N-type semiconductor region 123 and a P-type semiconductor region 124 is formed on the side of the pixel center surrounded by the DTI 121 at the pixel boundary portion. The electrons obtained by photoelectrically converting the incident light are accumulated in the N-type semiconductor region 123.

The transfer transistor MT and a high-concentration N-type semiconductor region 125A functioning as the floating diffusion PD are formed on an interface on the front surface side of the semiconductor substrate 111.

The high-concentration N-type semiconductor region 125A functioning as the floating diffusion FD is surrounded by a P-type semiconductor region 124, except for the N-type semiconductor region 123 on a path functioning as a transfer path for electric charges (electrons).

A control signal line 130 of a gate electrode MT_G connected to the gate electrode MT_G of the transfer transistor MT is formed closer to the second substrate 11B than the gate electrode MT_G of the transfer transistor MT formed on the front surface side of the semiconductor substrate 111. A light-shielding film 127 containing a metal material such as tungsten (W), aluminum (Al), or copper (Cu) is formed much closer to the second substrate 11B than the control signal line 130. The light-shielding film 127 shields light entering from the back surface side of the semiconductor substrate 111 so as not to reach the second substrate 11B. This reduces the parasitic light sensitivity (PLS).

In the second substrate 11B, insulating films 132 and 133 are formed on the side of the first substrate 11A and the side of the third substrate 11C of a semiconductor substrate 131, respectively, using, for example, silicon (Si) as a semiconductor.

A plurality of MOS transistors TR is formed on the interface of the semiconductor substrate 131 on the side of the first substrate 11A (for example, substrate front surface side). The MOS transistors formed on the semiconductor substrate 131 includes, for example, the reset transistor MR, the amplification transistor MA, the select transistor MS, the load transistor ML, or the like.

The floating diffusion FD formed on the front surface side of the first substrate 11A (side of second substrate 11B) is connected to a circuit formed on the second substrate 11B. The specific connection destinations include the gate electrode of the amplification transistor MA, the N-type semiconductor region functioning as the source region of the reset transistor MR, the N-type semiconductor region that is different from the source region of the reset transistor MR and is electrically connected to the source region of the reset transistor MR, or the input unit of the comparator (comparator) 41. These gate electrodes, the N-type semiconductor regions, or the input unit and the floating diffusion FD formed on the first substrate 11A are electrically and physically connected to each other by bonding a conductive connecting portion 126 formed in a stacking direction (substrate depth direction) of the insulating film 113 to a conductive connecting portion 129 formed in a stacking direction of the insulating film 132 of the second substrate 11B. The materials of the conductive connecting portions 126 and 129 are, for example, Cu, Al, and the like. It should be noted that the conductive connecting portion that electrically and physically connects the gate electrode, the N-type semiconductor region, or the input unit and the floating diffusion FD formed on the first substrate 11A is not limited to these two conductive connecting portions 126 and 129, and more conductive connecting portions may be used for connection.

Further, an air gap 128 is formed around the conductive connecting portions 126 and 129. As the air gap 128 is formed around the conductive connecting portions 126 and 129, the fringe capacity generated around the conductive connecting portions 126 and 129 can be reduced. Further, assuming that two conductive connecting portions 126 and two conductive connecting portions 129 adjacent to each other in a plane direction are referred to as "first conductive connecting portions 126 and 129" and "second conductive connecting portions 126 and 129" the air gap 128 is present between the first conductive connecting portions 126 and 129 and the second conductive connecting portions 126 and 129, and thus crosstalk between the first conductive connecting portions 126 and 129 and the second conductive connecting portions 126 and 129 can be reduced. It should be noted that instead of the air gap 128, a low dielectric constant insulating film (Low-k insulating film) can also reduce the fringe capacitance.

The circuit formed on the side of the first substrate 11A of the semiconductor substrate 131 is electrically connected to the circuit formed on the side of the second substrate 11B of a semiconductor substrate 141 of the third substrate 11C via a through electrode 134 penetrating the semiconductor substrate 131 and a conductive connecting portion 135. The through electrode 134 and the conductive connecting portion 135 are also connected by metal bonding using a metal material such as Cu or Al.

<11. Example of Planar Structure of Pixel Array>

Figure 15:
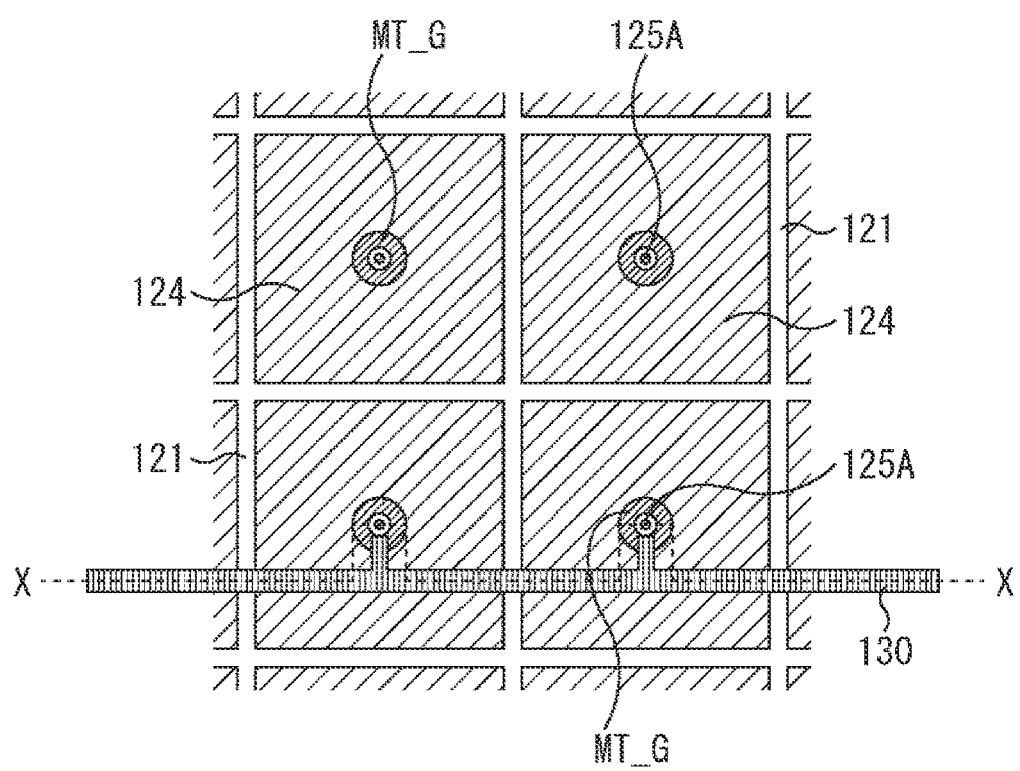
FIG. 15 is a diagram illustrating an example of a planar structure of the pixel array.

FIG. 15 is a plan view corresponding to 2×2, or 4 pixels on the front surface side (side of second substrate 11B) of the semiconductor substrate 111 of the first substrate 11A on which the transfer transistor MT is formed.

Of the four pixels illustrated in FIG. 15, the upper two pixels represent the shape of the gate electrode MT_G of the transfer transistor MT on the front surface side of the semiconductor substrate 111 of the first substrate 11A. Of the four pixels illustrated in FIG. 15, the lower two pixels represent the shapes of the gate electrode MT_G of the transfer transistor MT on the front surface side of the semiconductor substrate 111 of the first substrate 11A and the control signal line 130 of the gate electrode MTG connected to the gate electrode MT_G of the transfer transistor MT.

The X-X line indicated by a broken line in FIG. 15 represents a cross-sectional line of the cross-sectional view illustrated in FIG. 14.

As illustrated in FIG. 15, the gate electrode MT_G of the transfer transistor MT and the N-type semiconductor region 125A functioning as the floating diffusion FD are formed so as to have an optically symmetrical arrangement with respect to the photoelectric conversion region (N-type semiconductor region 123 and P-type semiconductor region 124) of the rectangular pixel PX.

Specifically, in the plan view of the rectangular pixel PX, the rectangular photoelectric conversion region provided in the pixel PX is arranged so that its center matches the center of the pixel PX. The N-type semiconductor region 125A functioning as the floating diffusion FD is arranged in the center of the pixel PX and the photoelectric conversion region, and the gate electrode MT_G of the transfer transistor MT is arranged in a ring shape so as to surround the floating diffusion FD. As a result, the floating diffusion FD and the transfer transistor MT are arranged at positions optically symmetrical with respect to each of the pixel PX and the photoelectric conversion region. Consequently, the optical characteristics (for example, light receiving sensitivity) of pixels and the electric charge transfer characteristics can be kept uniform, and these pixel characteristics can be kept uniform among a plurality of pixels provided in the pixel array.

It should be noted that as illustrated in FIG. 15, the gate electrode MT_G of the transfer transistor MT and the floating diffusion FD have an optically symmetrical arrangement, but as illustrated in FIG. 14, the P-type semiconductor region 124 around the N-type semiconductor region 125A is formed optically asymmetrically in order to provide a transfer path or the electric charges.

Figure 16:
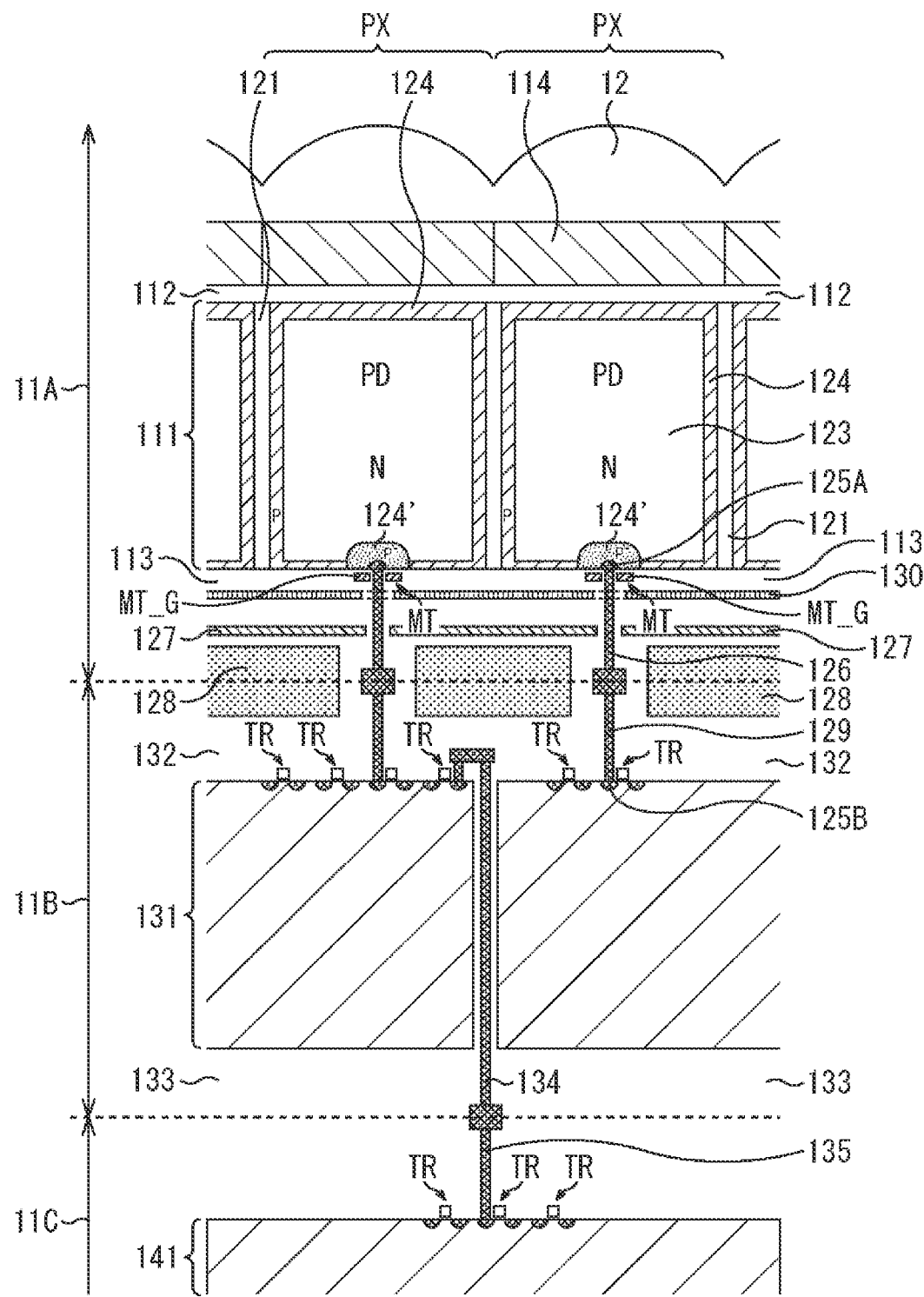
FIG. 16 is a diagram illustrating an example of another cross-sectional structure of the pixel array.

Here, for example, as illustrated in FIG. 16, by uniformly arranging a low-concentration P-type semiconductor region 124' around the N-type semiconductor region 125A, the optically symmetrical arrangement can be achieved. Further, the transfer path for the electric charges may be formed optically symmetrically by changing the concentration of P-type impurities in a predetermined optically symmetric direction (path) of the P-type semiconductor region 124'.

Figure 17:
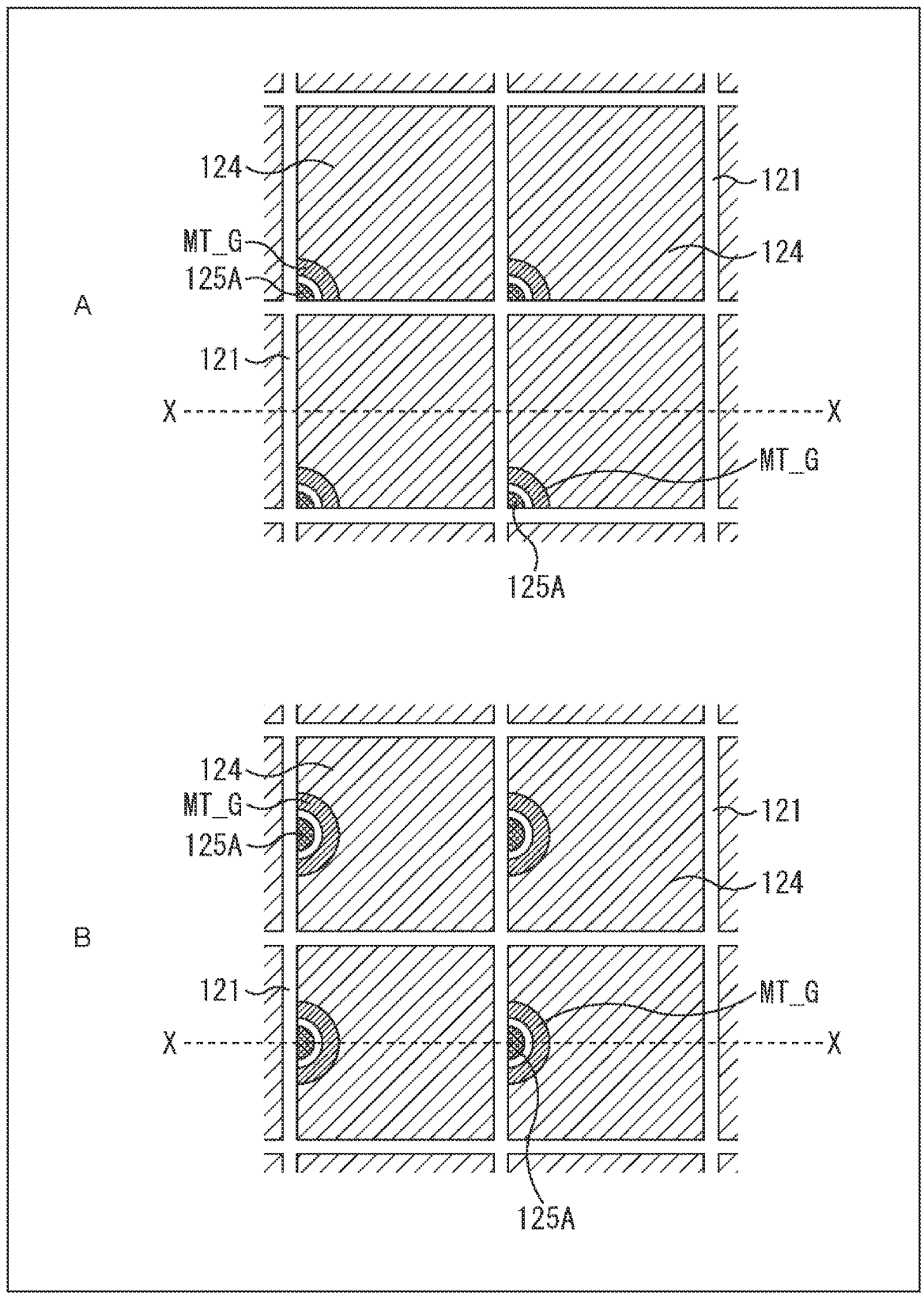
FIG. 17 is a diagram illustrating an example of another planar structure of the pixel array.

The gate electrode MT_G of the transfer transistor MT and the N-type semiconductor region 125A functioning as the floating diffusion FD are preferably arranged in the center of the pixel to achieve the optically symmetrical arrangement as illustrated in FIG. 15, but other arrangements are also possible. For example, as illustrated in A of FIG. 17, the gate electrode MT_G of the transfer transistor MT and the N-type semiconductor region 125A functioning as the floating diffusion FD may be arranged at the corner of the photoelectric conversion region (N-type semiconductor region 123 and P-type semiconductor region 124) of the rectangular pixel PX, or may be arranged on a predetermined side of the rectangle, as illustrated in B of FIG. 17.

<12. Relationship of Outer Shapes of Respective Blocks of Three Layers>

Here, the relationship of the outer shapes of the pixel block 21 provided on the first substrate 11A, the circuit provided on the second substrate 11B in a one-to-one correspondence with the pixel block 21 (hereinafter, also referred to as "second circuit"), and the circuit provided on the third substrate 11C in a one-to-one correspondence with the pixel block 21 (hereinafter, also referred to as "third circuit") will be described.

(1) The outer shape of the pixel block 21, the outer shape of the second circuit, and the outer shape of the third circuit may be squares having the same area.

(2) The outer shape of the pixel block 21 may be square, and at least one of the outer shape of the second circuit or the outer shape of the third circuit may be rectangle and the area thereof may be equal to that of the pixel block 21.

(3) The cuter shape of the pixel block 21 may be rectangle. As an example, in a case where one pixel block 21 includes four pixels, the pixel block 21 may have a rectangular shape in which four pixels are arranged in a row. As another example, in a case where one pixel block 21 includes eight pixels, the pixel block 21 may have a rectangular shape in which eight pixels are arranged in an array having a plurality of pixels vertically and horizontally, such as 2×4 or 4×2. Then, in a case where the outer shape of the pixel block 21 is rectangle as in these examples, the outer shape of the second circuit and the outer shape of the third circuit may be rectangle, and the area and aspect ratio (length of long side/length of short side) may be the same as those of the pixel block 21.

(4) In a case where the outer shape of the pixel block 21 is rectangle as in (3) described above, at least one of the outer shape of the second circuit or the outer shape of the third circuit may be rectangle, the area thereof may be equal to that of the pixel block 21, and the aspect ratio (length of long side/length of short side) may be larger than that of the pixel block 21.

(5) In a case where the outer shape, of the pixel block 21 is rectangle as in (3) described above, at least one of the outer shape of the second circuit or the outer shape of the third circuit may be rectangle, the area thereof may be equal to that of the pixel block 21, and the aspect ratio (length of long side/length of short side) may be smaller than that of the pixel block 21.

(6) In a case where the outer shape of the pixel block 21 is rectangle as in (3) described above, at least one of the outer shape of the second circuit or the outer shape of the third circuit may be square and the area thereof may be equal to that of the pixel block 21.

<13. Positional Relationship of Respective Blocks of Three Layers>

Next, the planar positional relationship between the pixel block 21, the ADC analog block 31, and the ADC digital memory block 51 corresponding to each other will be described.

The planar positional relationship of the corresponding respective blocks may be the same or different in the three-layer substrate 11. Further, the shape and size of planar regions of the corresponding respective blocks may be the same or different.

Figure 18:
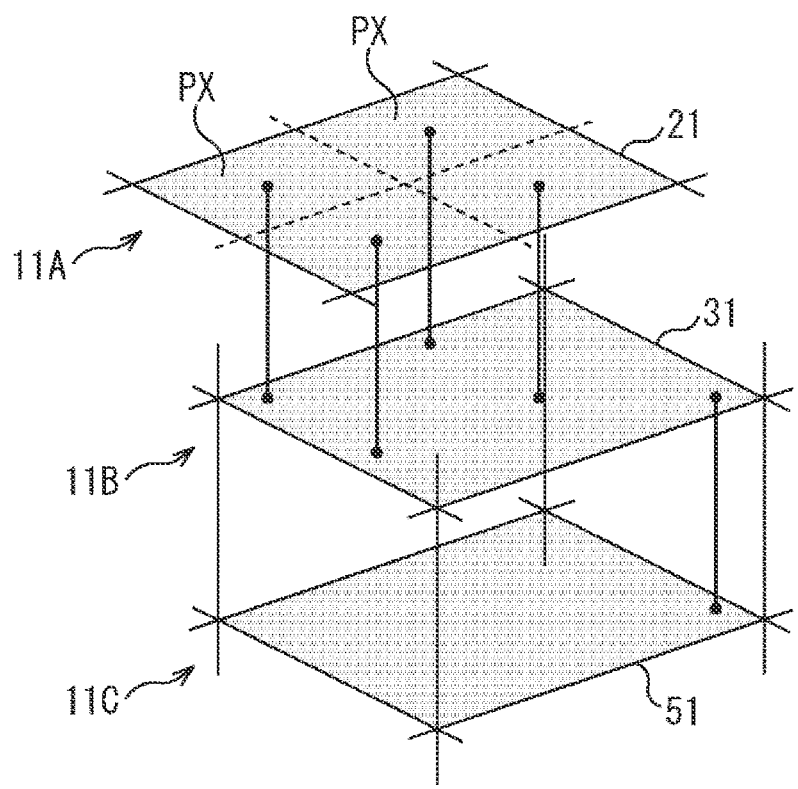
FIG. 18 is a diagram illustrating an example of a first positional relationship of the respective blocks of three layers.

For example, FIG. 18 illustrates an example in which the planar position of the pixel block 21 of the first substrate 11A is shifted from the planar position of the ADC analog block 31 of the second substrate 11B, and the planar position of the ADC analog block 31 of the second substrate 11B matches the planar position of the ADC digital memory block 51 of the third substrate 11C.

Figure 19:
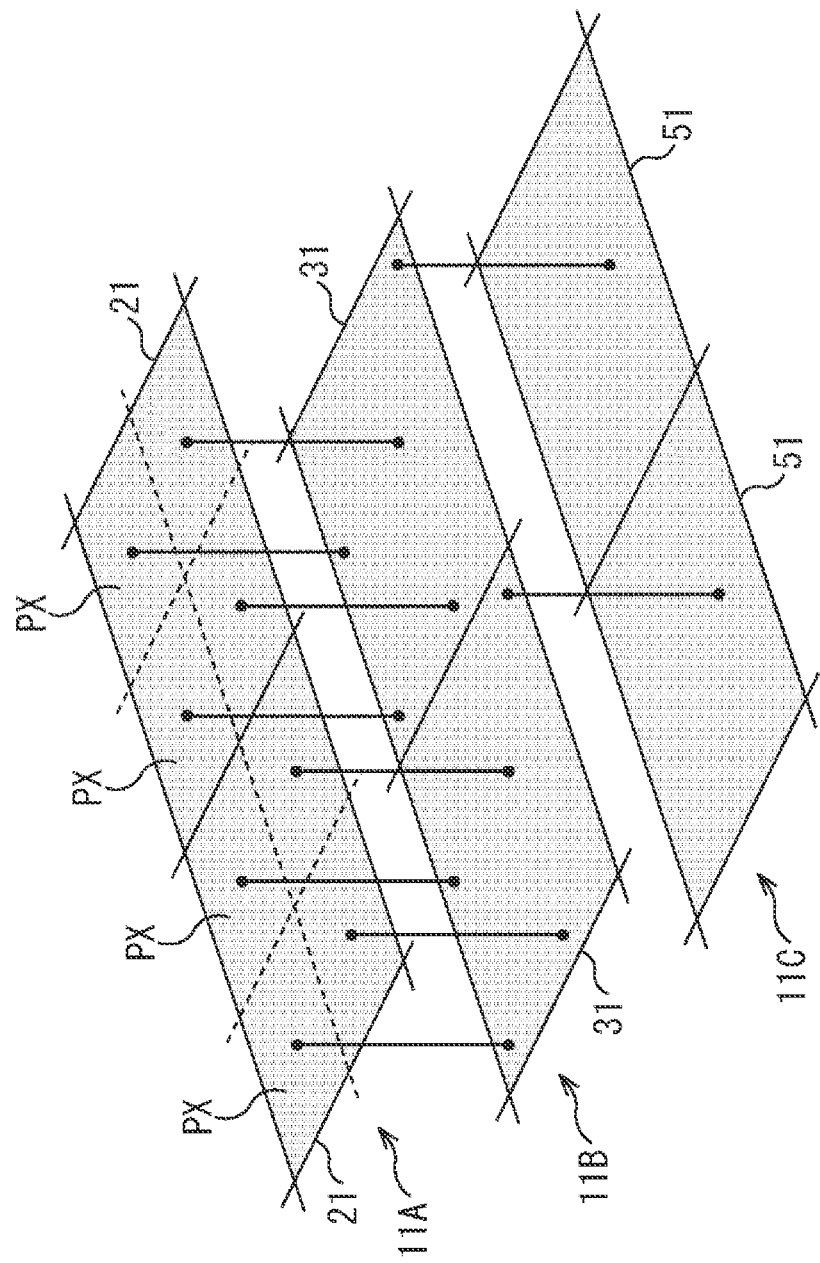
FIG. 19 is a diagram illustrating an example of a second positional relationship of the respective blocks of the three layers.

FIG. 19 illustrates an example in which the planar position of the pixel block 21 of the first substrate 11A is shifted from the planar position of the ADC analog block 31 of the second substrate 11B, and the planar position of the ADC analog block 31 of the second substrate 11B is also shifted from the planar position of the ADC digital memory block 51 of the third substrate 11C.

Figure 20:
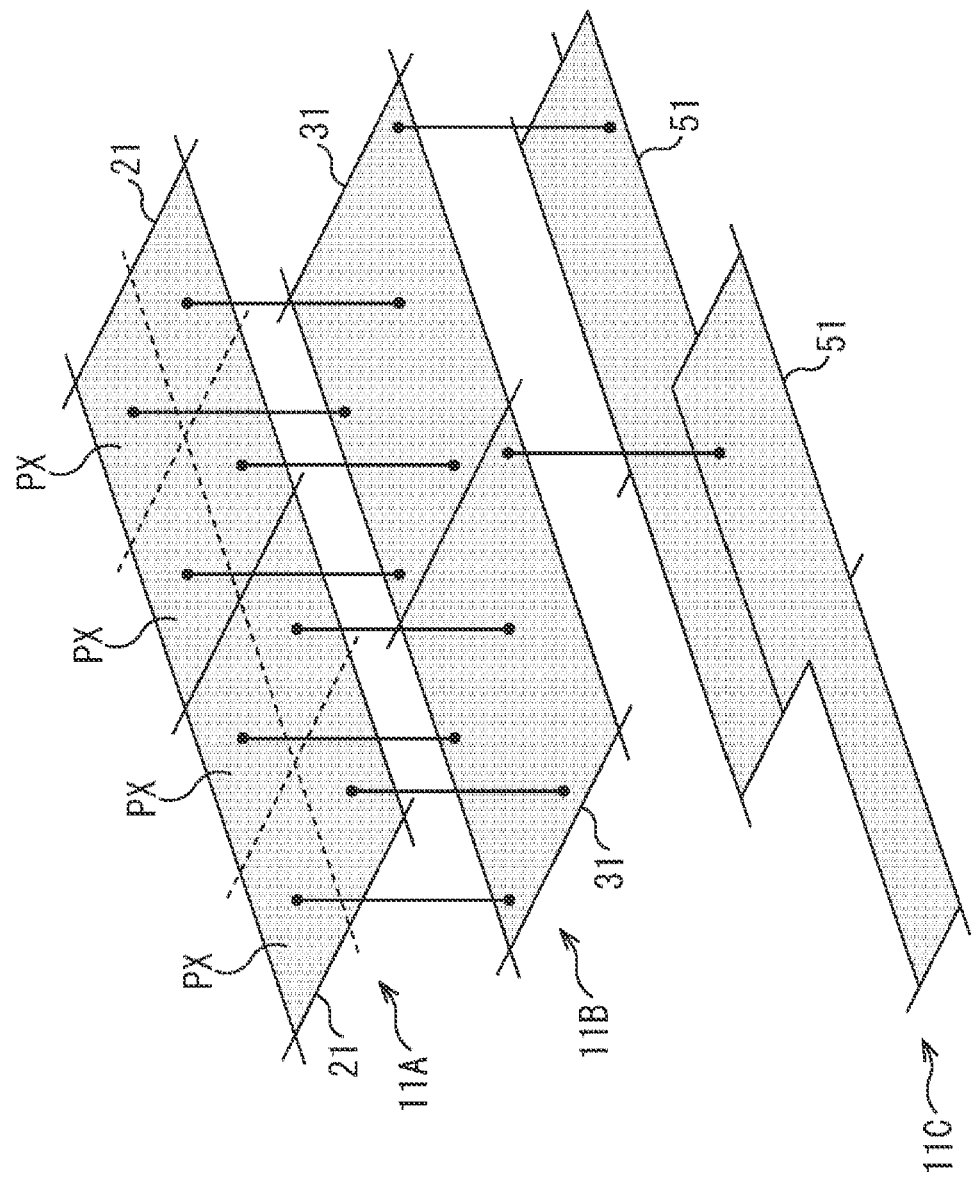
FIG. 20 is a diagram illustrating an example of a third positional relationship of the respective blocks of the three layers.

FIG. 20 illustrates an example in which the planar position of the pixel block 21 of the first substrate 11A is shifted from the planar position of the ADC analog block 31 of the second substrate 11B, the planar position of the ADC analog block 31 of the second substrate 11B is also shifted from the planar position of the ADC digital memory block 51 of the third substrate 11C, and the shape of the ADC analog block 31 is further different from the shape of the ADC digital memory block 51.

<14. Example of Arrangement of Gray Code Generation Circuit>

Next, an example of arrangement of the Gray code generation circuit 52 on the third substrate 11C will be described.

As illustrated in FIG. 11, it may be configured to provide only one Gray code generation circuit 52 for all the ADC digital memory blocks 51 of the third substrate 11C, or it may also be configured to provide the Gray code generation circuit in a one-to-one correspondence with the ADC digital memory block 51 as illustrated in FIG. 12. Further, as an intermediate configuration between these configurations, it may also be configured to provide one Gray code generation circuit 52 for a plurality of the ADC digital memory blocks 51.

Figure 21:
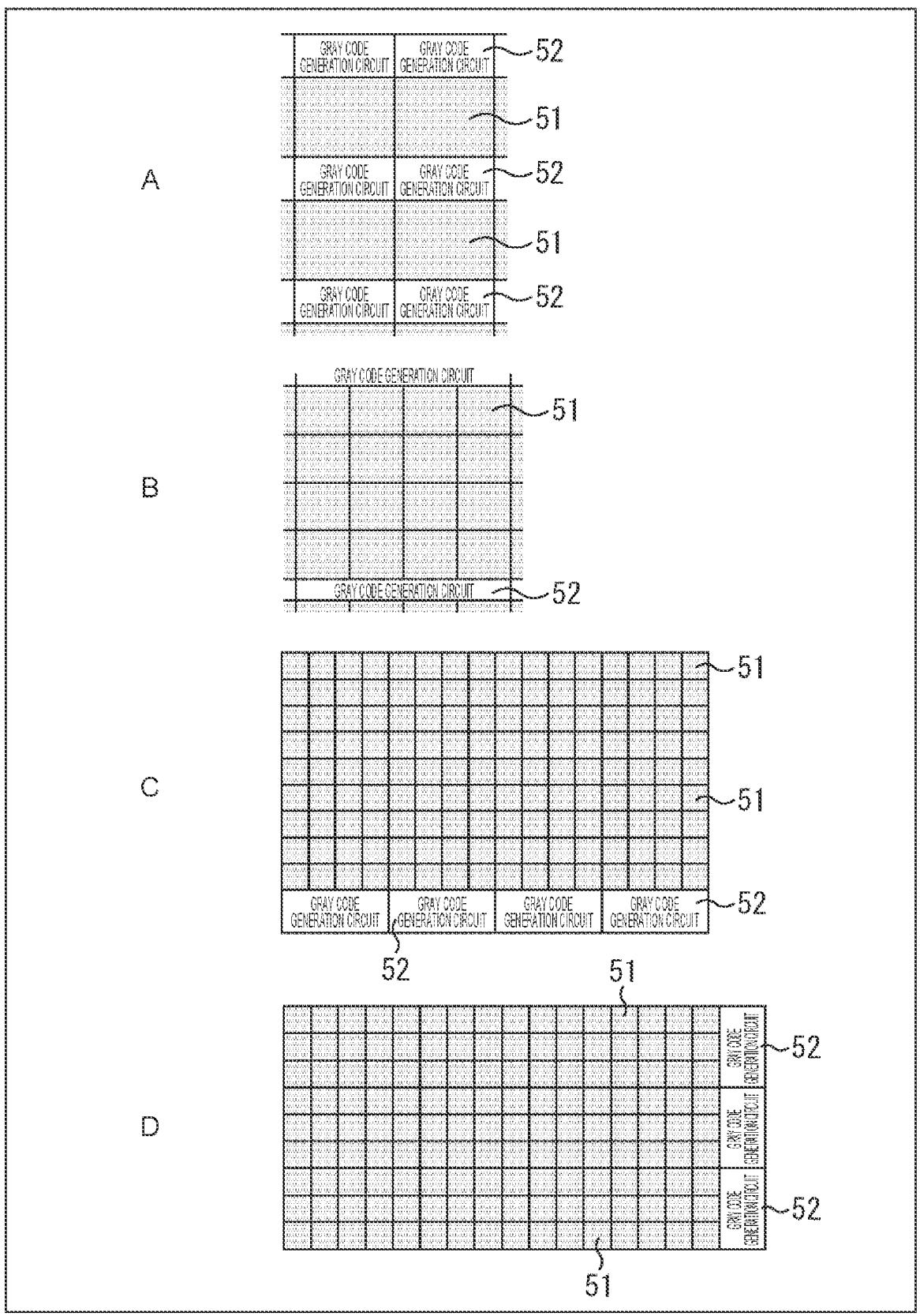
FIG. 21 is a diagram illustrating an example of arrangement of a Gray code generation circuit.

As for the arrangement of the Gray code generation circuit 52, for example, various arrangements illustrated in A to D of FIG. 21 are possible.

A of FIG. 21 illustrates an example of arrangement of the Gray code generation circuit 52 in a case where one Gray code generation circuit 52 is provided for each ADC digital memory block 51. The Gray code generation circuits 52 are arranged adjacent to each other in the horizontal direction or vertical direction of the ADC digital memory block 51. A of FIG. 21 illustrates an example in which the Gray code generation circuits 52 are arranged adjacent to each other in the vertical direction.

B of FIG. 21 illustrates an example of arrangement of the Gray code generation circuit 52 in a case where one Gray code generation circuit 52 is provided for a plurality of the ADC digital memory blocks 51. The Gray code generation circuits 52 are arranged adjacent to each other in the horizontal or vertical direction of a plurality of the ADC digital memory blocks 51. B of FIG. 21 illustrates an example in which the Gray code generation circuits 52 are arranged adjacent to each other in the vertical direction.

It should be noted that one Gray code generation circuit 52 is arranged for 2×2, or four ADC digital memory blocks 51 in B of FIG. 21, but it is not limited to the example of four ADC digital memory blocks 51. Furthermore, the number of the ADC digital memory blocks 51 in the horizontal direction does not need to be equal to the number of the ADC digital memory blocks 51 in the vertical direction.

C of FIG. 21 illustrates an example of arrangement of the Gray code generation circuit 52 in a case where one Gray code generation circuit 52 is provided for a of columns of the ADC blocks 51.

C of FIG. 21, one Gray code generation circuit 52 is arranged for four columns of the ADC digital memory blocks 51, but one Gray code generation circuit 52 may be arranged for a plurality of columns other than four columns, or one column.

D of FIG. 21 illustrates an example of arrangement of the Gray code generation circuit 52 in a case where one Gray code generation circuit 52 is provided for a plurality of rows of the ADC digital memory blocks 51. In C of FIG. 21, one Gray code generation circuit 52 is arranged for three rows of the ADC digital memory blocks 51, but one Gray code generation circuit 52 may be arranged for a plurality of rows other than three rows, or one row.

<15. Example of Application to Electronic Apparatus>

The present technology is not limited to application to a solid-state image capturing device. That is, the present technology is applicable to all electronic apparatuses using a solid-state image capturing device as an image fetching unit (photoelectric conversion unit), such as an image capturing device such as a digital still camera or a video camera, a mobile terminal device having an image capturing function, and a copying machine using a solid-state image capturing device as an image reading unit. The solid-state image capturing device may be in the form of one chip, or may be in the form of a module having an image capturing function in which an image capturing unit and a signal processing unit or an optical system are packaged together.

Figure 22:
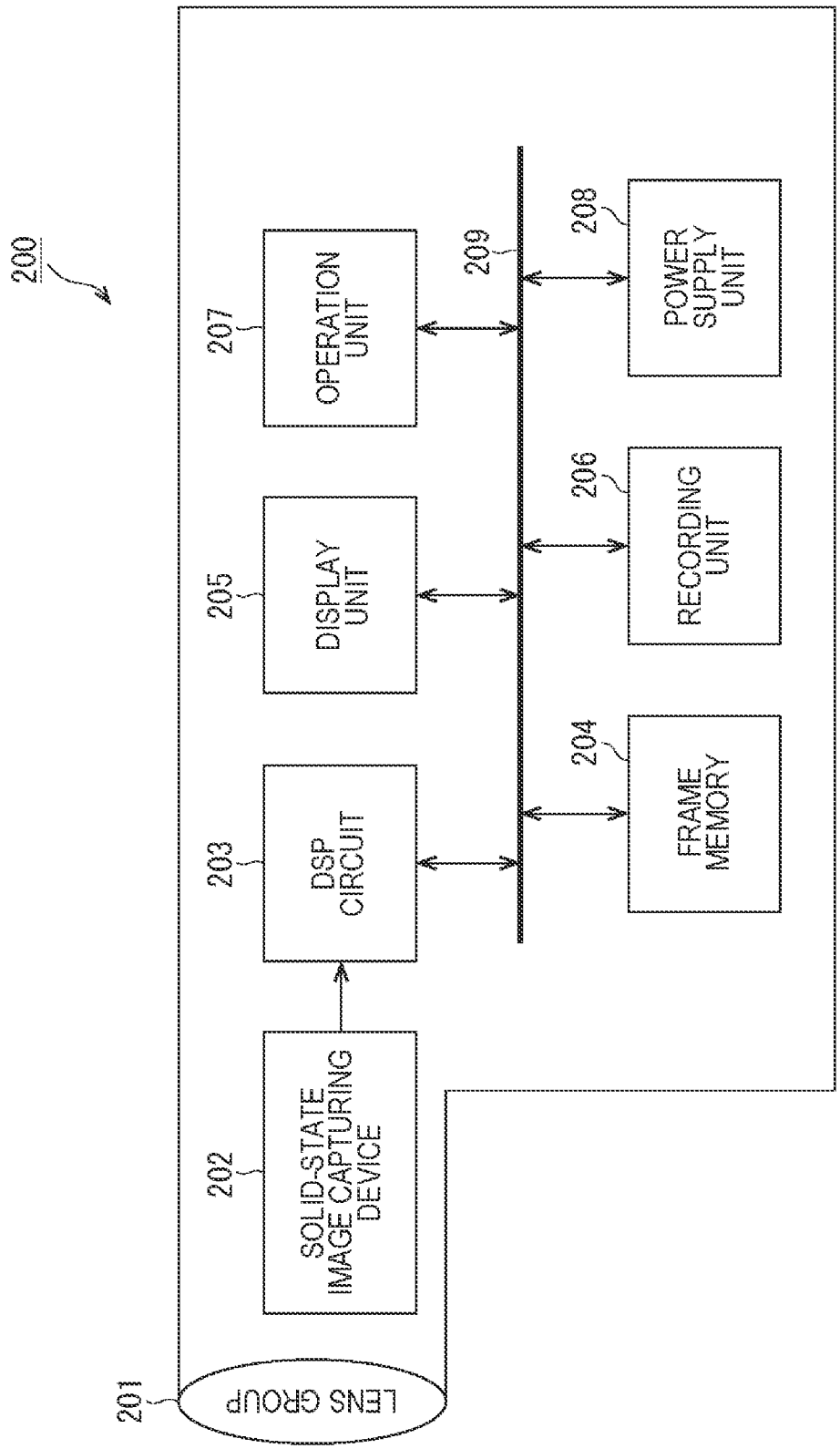
FIG. 22 is a block diagram illustrating a configuration example of an image capturing device as an electronic apparatus to which the present technology is applied.

FIG. 22 is a block diagram illustrating a configuration example of an image capturing device as an electronic apparatus to which the present technology is applied.

An image capturing device 200 illustrated in FIG. 22 includes an optical unit 201 including a lens group and the like, a solid-state image capturing device (image capturing device) 202 that adopts the configuration of the solid-state image capturing device 1 illustrated in FIG. 1, and a digital signal processor (DSP) circuit 203 functioning as a camera signal processing circuit. In addition, the image capturing device 200 also includes a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are connected to each other via a bus line 209.

The optical unit 201 takes incident light (image light) from a subject and forms an image on the image capturing surface of the solid-state image capturing device 202. The solid-state image capturing device 202 converts the amount of incident light imaged on the image capturing surface by the optical unit 201 into an electric signal on a pixel basis and outputs the electric signal as a pixel signal. The solid-state image capturing device 1 illustrated in FIG. 1, that is, the solid-state image capturing device that has a three-layer stacked structure in which one pixel block 21 includes a plurality of pixels, and the ADC analog block 31 and the ADC digital memory block 51 that correspond to the pixel block 21 are arranged on separate substrates can be used as the solid-state image capturing device 202.

The display unit 205 is configured with, for example, a thin display such as a liquid crystal display (LCD) or an organic electro luminescence (EL) display, and displays a moving image or a still image captured by the solid-state image capturing device 202. The recording unit 206 records the moving image or still image captured by the solid-state image capturing device 202 in a recording medium such as a hard disk or a semiconductor memory.

The operation unit 207 issues operation commands for various functions of the image capturing device 200 under the user's operation. The power supply unit 208 appropriately supplies various power supplies that function as operating power supplies for the DSP circuit 203, the frame memory 204, the display unit 205, the recording unit 206, and the operation unit 207 to these supply targets.

As described above, by using the solid-state image capturing device 1 including the comparator 41 and the memory unit 62 for each pixel block 21 as the solid-state image capturing device 202, and appropriately arranging the analog circuit and the digital circuit on the three-layer substrate 11, it is possible to Generate an image with reduced noise. Consequently, the image quality of a captured image can be improved in the image capturing device 200 such as a video camera, a digital still camera, or a camera module for mobile devices such as mobile phones.

<Usage Example of Image Sensor>

Figure 23:
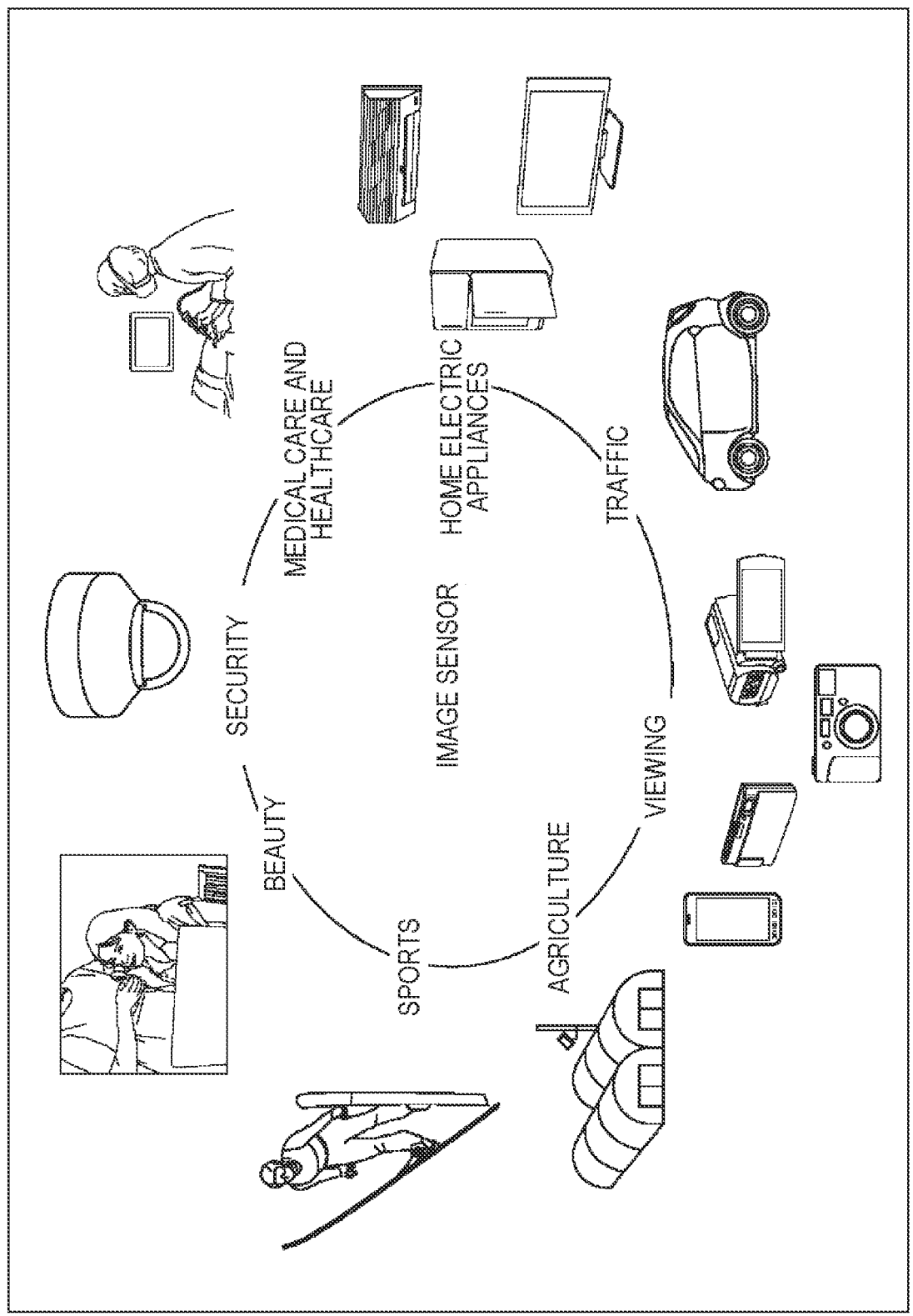
FIG. 23 is an explanatory view of a usage example of an image sensor.

FIG. 23 is a diagram illustrating a usage example of an image sensor using the solid-state image capturing device 1 described above.

The image sensor using the solid-state image capturing device 1 described above can be used in various cases of sensing light such as visible light, infrared light, ultraviolet light, and X-rays, as described below.

Devices that capture images used for viewing, such as digital cameras and mobile devices with camera functions Devices used for traffic, such as in-vehicle sensors that capture images of the front, rear, surroundings, inside, and the like of a vehicle, monitoring cameras that monitor traveling vehicles and roads, and distance measurement sensors for measuring the distance between vehicles, for the purpose of safety driving such as automatic stop and recognizing a driver's condition Devices used for home electric appliances such as TVs, refrigerators, and air conditioners in order to capture user gestures and operate devices according to the gestures Devices used for medical care and healthcare, such as endoscopes and devices that capture images of blood vessels by receiving infrared light Devices used for security, such as surveillance cameras for crime prevention and cameras for personal authentication.

Devices used for beauty care, such as skin measuring instruments that capture images of skin and microscopes that capture images of scalp Devices used for sports such as action cameras and wearable cameras for sports applications Devices used for agriculture, such as cameras for monitoring the condition of fields and crops <16. Example of Application to Moving Body>

The technology according to the present disclosure (present technology) can be applied to various products. For example, the technology according to the present disclosure may be achieved as a device mounted on any type of moving bodies such as an automobile, an electric vehicle, a hybrid electric vehicle, a motorcycle, a bicycle, personal mobility, an airplane, a drone, a and a robot.

Figure 24:
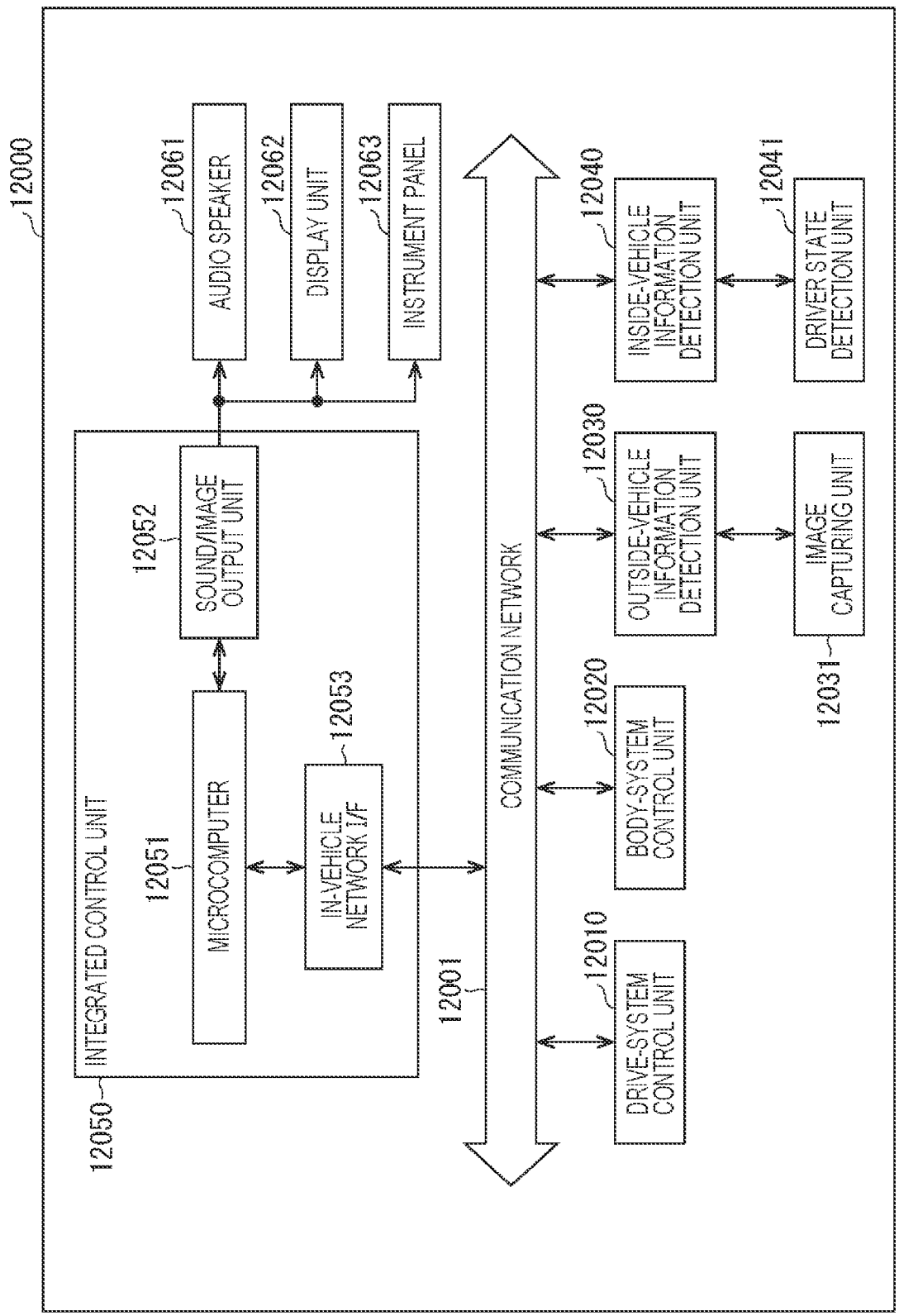
FIG. 24 is a block diagram illustrating an example of a schematic configuration of a vehicle control system.

FIG. 24 is a block diagram illustrating a schematic configuration example of a vehicle control system that is an example of a moving body control system to which the technology according to the present disclosure can be applied.

A vehicle control system 12000 includes a plurality of electronic control units connected to each other via a communication network 12001. In the example illustrated in FIG. 24, the vehicle control system 12000 includes a drive-system control unit 12010, a body-system control unit 12020, an outside-vehicle information detection unit 12030, an inside-vehicle information detection unit 12040, and an integrated control unit 12050. Further, as a functional configuration of the integrated control unit 12050, a microcomputer 12051, a sound/image output unit 12052, and an in-vehicle network interface (I/F) 12053 are illustrated.

The drive-system control unit 12010 controls the operation of devices related to the drive system of a vehicle according to various programs. For example, the drive-system control unit 12010 functions as a drive force generation device for generating a drive force of a vehicle such as an internal combustion engine or a drive motor, a drive force transmission mechanism for transmitting a drive force to wheels, a steering mechanism for adjusting the steering angle of a vehicle, and a control device such as a braking device for generating a braking force of a vehicle.

The body-system control unit 12020 controls the operation of various devices mounted on a vehicle body according to various programs. For example, the body-system control unit 12020 functions as a keyless entry system, a smart key system, a power window device, or a control device for various lamps such as a head lamp, a back lamp, a brake lamp, a winker, and a fog lamp. In this case, radio waves transmitted from portable devices that substitute for a key or signals from various switches may be input to the body-system control unit 12020. The body-system control unit 12020 receives the input of these radio waves or signals, and controls a vehicle door lock device, a power window device, a lamp, and the like.

The outside-vehicle information detection unit 12030 detects information outside a vehicle in which the vehicle control system 12000 is incorporated. For example, an image capturing unit 12031 is connected to the outside-vehicle information detection unit 12030. The outside-vehicle information detection unit 12030 causes the image capturing unit 12031 to capture an image of the outside of the vehicle, and receives the captured image. The outside-vehicle information detection unit 12030 may perform an object detection process or a distance detection process on people, vehicles, obstacles, signs, characters on road surfaces, or the like, on the basis of the received image.

The image capturing unit 12031 is an optical sensor that receives light and outputs an electrical signal according to the amount of received light. The image capturing unit 12031 can output an electric signal as an image and also as distance measurement information. Further, the light received by the image capturing unit 12031 may be visible light or invisible light such as infrared light.

The inside-vehicle information detection unit. 12040 detects information inside a vehicle. For example, a driver state detection unit 12041 that detects the state of a driver is connected to the inside-vehicle information detection unit 12040. The driver state detection unit 12041 includes, for example, a camera that captures images of the driver, and the inside-vehicle information detection unit 12040 may calculate the degree of fatigue or concentration of the driver, or may determine whether or not the driver is asleep, on the basis of the detection information input from the driver state detection unit 12041.

The microcomputer 12051 can calculate the control target value of a drive force generation device, a steering mechanism, or a braking device on the basis of the information inside and outside a vehicle, which is acquired by the outside-vehicle information detection unit 12030 or the inside-vehicle information detection unit 12040, and output a control command to the drive-system control unit 12010. For example, the microcomputer 12051 can execute cooperative control for the purpose of achieving the functions of advanced driver assistance system (ADAS) including collision avoidance or shock mitigation of vehicles, follow-up traveling based on an inter-vehicle distance, vehicle speed maintenance traveling, vehicle collision warning, or vehicle lane departure warning.

Furthermore, the microcomputer 12051 can control the drive force generation device, the steering mechanism, the braking device, or the like on the basis of the information around a vehicle, which is acquired by the outside-vehicle information detection unit 12030 or the inside-vehicle information detection unit 12040, to execute cooperative control for the purpose of autonomous driving or the like in which a vehicle autonomously travels without depending on a driver's operation.

Further, the microcomputer 12051 can output a control command to the body-system control unit 12020 on the basis of the information outside the vehicle acquired by the outside-vehicle information detection unit 12030. For example, the microcomputer 12051 can control headlamps according to the position of a preceding vehicle or an oncoming vehicle detected by the outside-vehicle information detection unit 12030, to execute cooperative control for the purpose of an antiglare process such as switching a high beam to a low beam.

The sound/image output unit 12052 transmits an output signal of at least one of a sound or an image to an output device capable of visually or audibly notifying an occupant of a vehicle or the outside of the vehicle of information. In the example illustrated in FIG. 24, an audio speaker 12061, a display unit 12062, and an instrument panel 12063 are illustrated as output devices. The display unit 12062 may include at least one of an onboard display or a head-up display, for example.

Figure 25:
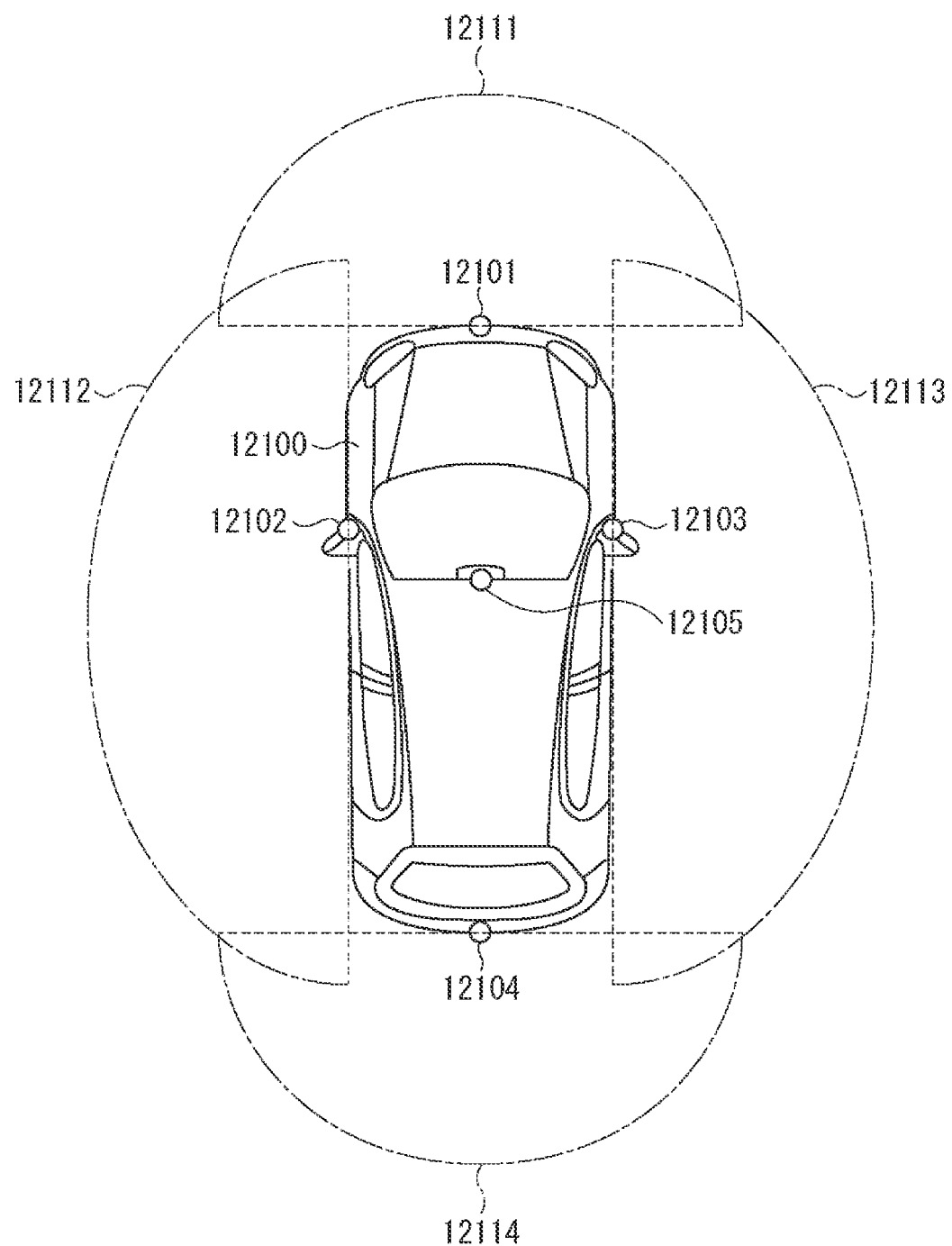
FIG. 25 is an explanatory view illustrating an example of installation positions of an outside-vehicle information detection unit and an image capturing unit.

FIG. 25 is a diagram illustrating an example of installation positions of the image capturing unit 12031.

In FIG. 25, a vehicle 12100 has image capturing units 12101, 12102, 12103, 12104, and 12105 as the image capturing unit 12031.

The image capturing units 12101, 12102, 12103, 12104, and 12105 are provided, for example, at positions such as the front nose, side mirrors, rear bumper, and back door of the vehicle 12100, and the upper portion of a windshield inside the vehicle. The image capturing unit 12101 provided on the front nose and the image capturing unit 12105 provided on the upper portion of the windshield inside the vehicle mainly acquire images in front of the vehicle 12100. The image capturing units 12102 and 12103 provided on the side mirrors mainly acquire images of the side of the vehicle 12100. The image capturing unit 12104 provided on the rear bumper or the back door mainly acquires images behind the vehicle 12100. The front images acquired by the image capturing units 12101 and 12105 are mainly used for detecting a preceding vehicle, a pedestrian, an obstacle, a traffic signal, a traffic sign, a lane, or the like.

It should be noted that FIG. 25 illustrates an example of image capturing ranges of the image capturing units 12101 to 12104. An image capturing range 12111 indicates the image capturing range of the image capturing unit 12101 provided on the front nose, image capturing ranges 12112 and 12113 respectively indicate the image capturing ranges of the image capturing units 12102 and 12103 provided on the side mirrors, and an image capturing range 12114 indicates the image capturing range of the image capturing unit 12104 provided on the rear bumper or the back door. For example, by superimposing pieces of the image data captured by the image capturing units 12101 to 12104, a bird's-eye view image of the vehicle 12100 viewed from above can be obtained.

At least one of the image capturing units 12101 to 12104, may have a function of acquiring distance information. For example, at least one of the image capturing units 12101 to 12104, may be a stereo camera including a plurality of image capturing elements or may be an image capturing element having pixels for phase difference detection.

For example, the microcomputer 12051 can calculate the distance to each three-dimensional object in the image capturing ranges 12111 to 12114 and the temporal change of this distance (relative speed to vehicle 12100) on the basis of the distance information obtained from the image capturing units 12101 to 12104 to extract a three-dimensional object that is closest to the vehicle 12100 on the traveling path of the vehicle 12100 and is traveling at a predetermined speed (for example, 0 km/h or higher) in substantially the same direction as the vehicle 12100 as a preceding vehicle. Further, the microcomputer 12051 can set an inter-vehicle distance to the preceding vehicle, the distance being to be secured in advance, and can execute automatic brake control (including follow-up stop control), automatic acceleration control (including follow-up start control), and the like. In this way, it is possible to execute cooperative control for the purpose of autonomous driving in which a vehicle autonomously travels without depending on a driver's operation, or the like.

For example, the microcomputer 12051 can classify three-dimensional object data regarding the three-dimensional object into two-wheeled vehicles, ordinary vehicles, large vehicles, pedestrian, telephone poles and other three-dimensional objects and extract the three-dimensional object data on the basis of the distance information obtained from the image capturing units 12101 to 12104, and use the extracted data for automatic avoidance of obstacles. For example, the microcomputer 12051 distinguishes obstacles around the vehicle 12100 into obstacles visible to the driver of the vehicle 12100 and obstacles difficult for the driver to visually recognize. Then, the microcomputer 12051 determines the collision risk indicating the risk of collision with each obstacle, and when the collision risk is equal to or more than a set value and here is a possibility of collision, the microcomputer 12051 can output an alarm to the driver through the audio speaker 12061 and the display unit 12062, or can perform forced deceleration or avoidance steering through the drive-system control unit 12010 to perform driving assistance to avoid collisions.

At least one of the image capturing units 12101 to 12104, may be an infrared camera that detects infrared rays. For example, the microcomputer 12051 can determine whether or not a pedestrian is present in images captured by the image capturing units 12101 to 12104 to recognize the pedestrian. Such pedestrian recognition is performed by, for example, a procedure of extracting feature points in images captured by the image capturing units 12101 to 12104 functioning as infrared cameras and a procedure of performing a pattern matching process on a series of feature points indicating the outline of an object to determine whether or not the object is a pedestrian. When the microcomputer 12051 determines that pedestrian is present in the images captured by the image capturing units 12101 to 12104 and recognizes the pedestrian, the sound/image output unit 12052 controls the display unit 12062 to superimpose a rectangular outline for emphasis on the recognized pedestrian for display. Alternatively, the sound/image output unit 12052 may control the display unit 12062 to display an icon indicating a pedestrian or the like at a desired position.

An example of the vehicle control system to which the technology according to the present disclosure can be applied has been described above. The technology according to the present disclosure can be applied to the image capturing unit 12031 among the configurations described above. Specifically, the solid-state image capturing device 1 described above can be applied as the image capturing unit 12031. By applying the technique according to the present disclosure to the image capturing unit 12031, a low noise image can be generated. In addition, the obtained image can be used to reduce the driver's fatigue and improve the safety level of the driver and a vehicle.

Further, the present technology is not limited to the application to a solid-state image capturing device that detects the distribution of the amount of incident visible light and captures the distribution as an image, and can be applied to solid-state image capturing devices that capture the distribution of the incident amount of infrared light, X-rays, particles, or the like as images and, in a broad sense, all solid-state image capturing devices (physical quantity distribution detection devices) that detect the distribution of other physical quantities such as a pressure and a capacitance and captures as images such as fingerprint detection sensors.

The embodiments of the present technology are not limited to the embodiments described above, and various changes can be made without departing from the gist of the present technology.

The configuration in which three substrates (semiconductor substrates) are stacked has been described in the above embodiments, but the number of stacked substrates is not limited to three, and may be four or more. For example, a memory unit (DRAM) can be formed on a fourth substrate to increase the number of frames that can be stored in the solid-state image capturing device 1.

For example, the mode in which all or a part of a plurality of the embodiments described above are combined can be adopted.

It should be noted that the effects described in the present specification are merely examples and are not limited, and effects other than those described in the present specification may be obtained.

Note that the present technology can also have the following configurations.

(1)

A solid-state image capturing device including at least three substrates that are stacked, in which for each pixel block including a plurality of pixels, a first substrate includes, for each of the pixels, a photoelectric conversion unit that generates electric charges according to incident light, a transfer transistor, and a floating diffusion, a second substrate includes one comparator that compares a signal according to a voltage of the floating diffusion with a reference signal, the plurality of pixels shares the comparator, a third substrate includes a code generation circuit that generates a code of a counter, a storage unit that stores the code, and a timing control circuit that controls a timing of storing the code in the storage unit, and the solid-state image capturing device further includes a pixel array in which a plurality of the pixel blocks is arranged.

(2)

The solid-state image capturing device according to (1) described above, in which the floating diffusion and a gate electrode of the transfer transistor are arranged at a center of the pixel and the photoelectric conversion unit in a plan view.

(3)

The solid-state image capturing device according to (1) or (2) described above, in which a gate electrode of the transfer transistor is a ring-shaped gate electrode that surrounds an entire circumference of the floating diffusion.

(4)

The solid-state image capturing device according to any one of (1) to (3) described above, in which the pixel block further includes a reset transistor, an amplification transistor, and a select transistor for each of the pixels in the second substrate.

(5)

The solid-state image capturing device according to any one of (1) to (3) described above, in which the pixel block further includes one reset transistor and one amplification transistor in the second substrate, and the plurality of pixels shares the reset transistor and the amplification transistor.

(6)

The solid-state image capturing device according to any one of (1) to (3) described above, in which the pixel block is configured such that a wire connected to each of a plurality of the floating diffusions is connected to one common wire, and the common wire is connected to the comparator included in the second substrate without an active element.

(7)

The solid-state image capturing device according to (5) or (6) described above, in which the pixel block is configured such that a wire connected to each of a plurality of the floating diffusions is connected to the second substrate for each of the floating diffusions, and is connected to one common wire in the second substrate.

(8)

The solid-state image capturing device according to (5) or (6) described above, in which the pixel block is configured such that a wire connected to each of a plurality of the floating diffusions is connected to one common wire in the first substrate, and the common wire is connected to the second substrate.

(9)

The solid-state image capturing device according to any one of (1) to (6) described above, in which the code generation circuit is shared by all the pixel blocks, arranged for one or a plurality of the pixel blocks, or arranged for one or more rows or one or more columns of the pixel blocks.

(10)

The solid-state image capturing device according to any one of (1) to (9) described above, in which an outer shape of the pixel block on each of the first to third substrates is rectangle, and an aspect ratio of the outer shape of the pixel block on at least one of the second substrate or the third substrate is different from an aspect ratio of the outer shape of the pixel block on the first substrate.

(11)

The solid-state image capturing device according to any one of (1) to (10) described above, further including a light-shielding film between the first substrate and the second substrate.

(12)

The solid-state image capturing device according to any one of (1) to (11) described above, further including an air gap around a connecting portion that connects a circuit arranged on the first substrate and a circuit arranged on the second substrate.

(13)

The solid-state image capturing device according to any one of (1) to (12) described above, in which the floating diffusion is surrounded by a P-type semiconductor region except for a part of an N-type semiconductor region extending to a photoelectric conversion region, in a semiconductor substrate on which the floating diffusion is formed.

(14)

The solid-state image capturing device according to any one of (1) to (12) described above, in which the floating diffusion is entirely surrounded by a P-type semiconductor region whose concentration is lower than a concentration of a P-type semiconductor region arranged in a peripheral portion of a pixel of a photoelectric conversion region, in a semiconductor substrate on which the floating diffusion is formed.

(15)

The solid-state image capturing device according to any one of (1) to (14) described above, in which the first substrate further includes a reset transistor, an amplification transistor, and a select transistor for each of the pixels.

(16)

The solid-state image capturing device according to any one of (1) to (15) described above, in which the first substrate further includes a reset transistor and an amplification transistor that are shared by the plurality of pixels included in the pixel block.

(17)

The solid-state image capturing device according to any one of (1) to (16), in which
the first substrate further includes a reset transistor and an amplification transistor for each of the pixels, and
the second substrate further includes a select transistor for each of the pixels.

(18)

A method of driving a solid-state image capturing device, in which
the solid-state image capturing device includes at least three substrates that are stacked,
for each pixel block including a plurality of pixels,
a first substrate includes, for each of the pixels, a photoelectric conversion unit that generates electric charges according to incident light, a transfer transistor, and a floating diffusion,
a second substrate includes one comparator that compares a signal according to a voltage of the floating diffusion with a reference signal,
the plurality of pixels shares the comparator,
a third substrate includes a code generation circuit that generates a code of a counter, a storage unit that stores the code, and a timing control circuit that controls a timing of storing the code in the storage unit, and
the solid-state image capturing device further includes a pixel array in which a plurality of the pixel blocks is arranged,
the method including:
by each pixel of the first substrate of the solid-state image capturing device, outputting a signal according to a voltage of the floating diffusion to the comparator;
by the comparator of the second substrate of the solid-state image capturing device, comparing the signal with the reference signal; and
by the storage unit of the third substrate of the solid-state image capturing device, storing the code supplied from the code generation circuit according to the timing based on a comparison result of the comparator, (19)

An electronic apparatus including a solid-state image capturing device, in which
the solid-state image capturing device includes at least three substrates that are stacked,
for each pixel block including a plurality of pixels,
a first substrate includes, for each of the pixels, a photoelectric conversion unit that generates electric charges according to incident light, a transfer transistor, and a floating diffusion,
a second substrate includes one comparator that compares a signal according to a voltage of the floating diffusion with a reference signal,
the plurality of pixels shares the comparator,
a third substrate includes a code generation circuit that generates a code of a counter, a storage unit that stores the code, and a timing control circuit that controls a timing of storing the code in the storage unit, and
the solid-state image capturing device further includes a pixel array in which a plurality of the pixel blocks is arranged.

REFERENCE SIGNS LIST

1 Solid-state image capturing device
11A First substrate
11B Second substrate
11C Third substrate
PX Pixel
PD Photodiode
MT Transfer transistor
FD Floating diffusion
MR Reset transistor
MA Amplification transistor
MS Select transistor
ML Load transistor
55 ALU
21 Pixel block
23 Common wire
31 ADD analog block
40 Common wire
41 Comparator
51 ADC digital memory block
52 Gray code generation circuit
53 Horizontal scanning circuit
61 Pulse generation circuit
62 Memory unit
111 Semiconductor substrate
127 Light-shielding film
128 Air gap
200 Image capturing device
202 Solid-state image capturing device

The invention claimed is:

1. A solid-state image capturing device including a pixel array in which a plurality of pixel blocks are arranged, each of the pixel blocks including a plurality of pixels, the solid-state image capturing device comprising:
a first substrate, a second substrate and a third substrate that are stacked, wherein
for each of the pixel blocks:
the first substrate includes, for each of the pixels, a photoelectric converter that generates electric charges according to incident light, a transfer transistor, and a floating diffusion, the floating diffusion and a gate electrode of the transfer transistor being arranged at a center of the pixel and the photoelectric converter in a plan view,
the second substrate includes a comparator that compares a signal according to a voltage of the floating diffusion with a reference signal,
the plurality of pixels shares the comparator, and
the third substrate includes a code generation circuit that generates a code of a counter, a memory that stores the code, and a timing control circuit that controls a timing of storing the code in the memory.

2. The solid-state image capturing device according to claim 1, wherein the code generation circuit is
shared by all the pixel blocks,
arranged for one or a plurality of the pixel blocks, or
arranged for one or more rows or one or more columns of the pixel blocks.

3. The solid-state image capturing device according to claim 1, further comprising
a light-shielding film between the first substrate and the second substrate.

4. The solid-state image capturing device according to claim 1, further comprising
an air gap around a connecting portion that connects a circuit arranged on the first substrate and a circuit arranged on the second substrate.

5. The solid-state image capturing device according to claim 1, wherein
the first substrate further includes a reset transistor, an amplification transistor, and a select transistor for each of the pixels.

6. The solid-state image capturing device according to claim 1, wherein
the first substrate further includes a reset transistor and an amplification transistor that are shared by the plurality of pixels included in the pixel block.

7. An electronic apparatus comprising a solid-state image capturing device according to claim 1.

8. A solid-state image capturing device including a pixel array in which a plurality of pixel blocks are arranged, each of the pixel blocks including a plurality of pixels, the solid-state image capturing device comprising:
a first substrate, a second substrate and a third substrate that are stacked, wherein
for each of the pixel blocks:
the first substrate includes, for each of the pixels, a photoelectric converter that generates electric charges according to incident light, a transfer transistor, and a floating diffusion, a gate electrode of the transfer transistor is a ring-shaped gate electrode that surrounds an entire circumference of the floating diffusion,
the second substrate includes a comparator that compares a signal according to a voltage of the floating diffusion with a reference signal,
the plurality of pixels shares the comparator, and
the third substrate includes a code generation circuit that generates a code of a counter, a memory that stores the code, and a timing control circuit that controls a timing of storing the code in the memory.

9. An electronic apparatus comprising a solid-state image capturing device according to claim 8.

10. A solid-state image capturing device including a pixel array in which a plurality of pixel blocks are arranged, each of the pixel blocks including a plurality of pixels, the solid-state image capturing device comprising:
a first substrate, a second substrate and a third substrate that are stacked, wherein
for each of the pixel blocks:
the first substrate includes, for each of the pixels, a photoelectric converter that generates electric charges according to incident light, a transfer transistor, and a floating diffusion,
the second substrate includes a comparator that compares a signal according to a voltage of the floating diffusion with a reference signal,
the plurality of pixels shares the comparator, and
the third substrate includes a code generation circuit that generates a code of a counter, a memory that stores the code, and a timing control circuit that controls a timing of storing the code in the memory, and
wherein the pixel block further includes a reset transistor, an amplification transistor, and a select transistor for each of the pixels in the second substrate.

11. An electronic apparatus comprising a solid-state image capturing device according to claim 10.

12. A solid-state image capturing device including a pixel array in which a plurality of pixel blocks are arranged, each of the pixel blocks including a plurality of pixels, the solid-state image capturing device comprising:
a first substrate, a second substrate and a third substrate that are stacked, wherein
for each of the pixel blocks:
the first substrate includes, for each of the pixels, a photoelectric converter that generates electric charges according to incident light, a transfer transistor, and a floating diffusion,
the second substrate includes a comparator that compares a signal according to a voltage of the floating diffusion with a reference signal,
the plurality of pixels shares the comparator, and
the third substrate includes a code generation circuit that generates a code of a counter, a memory that stores the code, and a timing control circuit that controls a timing of storing the code in the memory, and wherein
the pixel block further includes one reset transistor and one amplification transistor in the second substrate, and
the plurality of pixels shares the reset transistor and the amplification transistor.

13. The solid-state image capturing device according to claim 12, wherein
the pixel block is configured such that a wire connected to each of a plurality of the floating diffusions is connected to the second substrate for each of the floating diffusions, and is connected to one common wire in the second substrate.

14. The solid-state image capturing device according to claim 12, wherein
the pixel block is configured such that a wire connected to each of a plurality of the floating diffusions is connected to one common wire in the first substrate, and the common wire is connected to the second substrate.

15. An electronic apparatus comprising a solid-state image capturing device according to claim 12.

16. A solid-state image capturing device including a pixel array in which a plurality of pixel blocks are arranged, each of the pixel blocks including a plurality of pixels, the solid-state image capturing device comprising:
a first substrate, a second substrate and a third substrate that are stacked, wherein
for each of the pixel blocks:
the first substrate includes, for each of the pixels, a photoelectric converter that generates electric charges according to incident light, a transfer transistor, and a floating diffusion,
the second substrate includes a comparator that compares a signal according to a voltage of the floating diffusion with a reference signal,
the plurality of pixels shares the comparator, and
the third substrate includes a code generation circuit that generates a code of a counter, a memory that stores the code, and a timing control circuit that controls a timing of storing the code in the memory, and wherein
the pixel block is configured such that a wire connected to each of a plurality of the floating diffusions is connected to one common wire, and
the common wire is connected to the comparator included in the second substrate without an active element.

17. A solid-state image capturing device including a pixel array in which a plurality of pixel blocks are arranged, each of the pixel blocks including a plurality of pixels, the solid-state image capturing device comprising:
a first substrate, a second substrate and a third substrate that are stacked, wherein
for each of the pixel blocks:
the first substrate includes, for each of the pixels, a photoelectric converter that generates electric charges according to incident light, a transfer transistor, and a floating diffusion,
the second substrate includes a comparator that compares a signal according to a voltage of the floating diffusion with a reference signal,
the plurality of pixels shares the comparator, and the third substrate includes a code generation circuit that generates a code of a counter, a memory that stores the code, and a timing control circuit that controls a timing of storing the code in the memory, and wherein an outer shape of the pixel block on each of the first to third substrates is rectangle, and an aspect ratio of the outer shape of the pixel block on at least one of the second substrate or the third substrate is different from an aspect ratio of the outer shape of the pixel block on the first substrate.

18. A solid-state image capturing device including a pixel array in which a plurality of pixel blocks are arranged, each of the pixel blocks including a plurality of pixels, the solid-state image capturing device comprising:

a first substrate, a second substrate and a third substrate that are stacked, wherein for each of the pixel blocks:

the first substrate includes, for each of the pixels, a photoelectric converter that generates electric charges according to incident light, a transfer transistor, and a floating diffusion, the second substrate includes a comparator that compares a signal according to a voltage of the floating diffusion with a reference signal, the plurality of pixels shares the comparator, and the third substrate includes a code generation circuit that generates a code of a counter, a memory that stores the code, and a timing control circuit that controls a timing of storing the code in the memory, and wherein the floating diffusion is surrounded by a P-type semiconductor region except for a part of an IST-type semiconductor region extending to a photoelectric conversion region, in a semiconductor substrate on which the floating diffusion is formed.

19. A solid-state image capturing device including a pixel array in which a plurality of pixel blocks are arranged, each of the pixel blocks including a plurality of pixels, the solid-state image capturing device comprising:

a first substrate, a second substrate and a third substrate that are stacked, wherein for each of the pixel blocks:

the first substrate includes, for each of the pixels, a photoelectric converter that generates electric charges according to incident light, a transfer transistor, and a floating diffusion, the second substrate includes a comparator that compares a signal according to a voltage of the floating diffusion with a reference signal, the plurality of pixels shares the comparator, and the third substrate includes a code generation circuit that generates a code of a counter, a memory that stores the code, and a timing control circuit that controls a timing of storing the code in the memory, and wherein the floating diffusion is entirely surrounded by a P-type semiconductor region whose concentration is lower than a concentration of a P-type semiconductor region arranged in a peripheral portion of a pixel of a photoelectric conversion region, in a semiconductor substrate on which the floating diffusion is formed.

20. A solid-state image capturing device including a pixel array in which a plurality of pixel blocks are arranged, each of the pixel blocks including a plurality of pixels, the solid-state image capturing device comprising:

a first substrate, a second substrate and a third substrate that are stacked, wherein for each of the pixel blocks:

the first substrate includes, for each of the pixels, a photoelectric converter that generates electric charges according to incident light, a transfer transistor, and a floating diffusion, the second substrate includes a comparator that compares a signal according to a voltage of the floating diffusion with a reference signal, the plurality of pixels shares the comparator, and the third substrate includes a code generation circuit that generates a code of a counter, a memory that stores the code, and a timing control circuit that controls a timing of storing the code in the memory, and wherein the first substrate further includes a reset transistor and an amplification transistor for each of the pixels, and the second substrate further includes a select transistor for each of the pixels.

* * * * *